(12) United States Patent
Watanabe et al.

(10) Patent No.: US 7,507,508 B2
(45) Date of Patent: Mar. 24, 2009

(54) METHOD FOR MANUFACTURING A SEMICONDUCTOR DEVICE

(75) Inventors: Akira Watanabe, Kurokawa-gun (JP); Yasuhiro Yamamoto, Kurokawa-gun (JP)

(73) Assignee: OKI Semiconductor Co., Ltd, Tokyo (JP)

( * ) Notice: Subject to any disclaimer, the term of this patent is extended or adjusted under 35 U.S.C. 154(b) by 359 days.

(21) Appl. No.: 11/306,380

(22) Filed: Dec. 27, 2005

(65) Prior Publication Data

US 2006/0199089 A1 Sep. 7, 2006

(30) Foreign Application Priority Data

Dec. 28, 2004 (JP) ............................. 2004-379544

(51) Int. Cl.
*G03C 5/00* (2006.01)
*G03F 9/00* (2006.01)

(52) U.S. Cl. ........................................ 430/30; 430/312

(58) Field of Classification Search ................... 430/30, 430/312

See application file for complete search history.

(56) References Cited

U.S. PATENT DOCUMENTS

2003/0104292 A1    6/2003   Tomimatu

FOREIGN PATENT DOCUMENTS

| JP | 8/264409 A | 10/1996 |
| JP | 2003/168641 A | 6/2003 |
| JP | 2004/103674 A | 4/2004 |

*Primary Examiner*—Christopher G Young
(74) *Attorney, Agent, or Firm*—Rabin & Berdo, P.C.

(57) ABSTRACT

A method for manufacturing a semiconductor device is disclosed. The method can assess exposure conditions by forming a predetermined assessment pattern on a principal surface of a semiconductor wafer. The predetermined assessment pattern includes a first assessment pattern having a remaining pattern, and a second assessment pattern which includes a remaining pattern formed in a position lower than the first assessment pattern in the direction of the optical axis of an exposure device. The method includes a preparation step, and a step of manufacturing an actual semiconductor device. The preparation step includes a forming step, a measuring step, a calculating step, and a creating step. The step of manufacturing an actual semiconductor device includes a forming step, a measuring step, a calculating step and an assessing step.

18 Claims, 30 Drawing Sheets

Fig. 6

| AMOUNT OF EXPOSURE (mJ/cm$^2$) | PRIMARY APPROXIMATION FORMULA | COEFFICIENT | |
| --- | --- | --- | --- |
| | | a11 | b11 |
| 40 | y = 0.029214 x + 0.001229 | 0.029214 | 0.001069 |
| 42 | y = 0.032500 x + 0.001171 | 0.032500 | 0.001171 |
| 44 | y = 0.036857 x + 0.001257 | 0.036857 | 0.001257 |
| 46 | y = 0.041214 x + 0.001343 | 0.041214 | 0.001343 |
| 48 | y = 0.045571 x + 0.001429 | 0.045571 | 0.001429 |
| 50 | y = 0.049929 x + 0.001514 | 0.049929 | 0.001514 |
| 52 | y = 0.053214 x + 0.001587 | 0.053214 | 0.001587 |

Fig. 10

| FOCAL POSITION (μm) | PRIMARY APPROXIMATION FORMULA | COEFFICIENT ||
|---|---|---|---|
| | | a14 | b14 |
| -0.3 | y = -0.003850 x + 0.324800 | -0.003850 | 0.324800 |
| -0.2 | y = -0.003350 x + 0.311250 | -0.003350 | 0.311250 |
| -0.1 | y = -0.003100 x + 0.304000 | -0.003100 | 0.304000 |
| 0 | y = -0.003050 x + 0.301650 | -0.003050 | 0.301650 |
| 0.1 | y = -0.003250 x + 0.306500 | -0.003250 | 0.306500 |
| 0.2 | y = -0.003600 x + 0.314900 | -0.003600 | 0.314900 |
| 0.3 | y = -0.004096 x + 0.326836 | -0.004096 | 0.326836 |

Fig. 21

| AMOUNT OF EXPOSURE (mJ/cm²) | PRIMARY APPROXIMATION FORMULA | COEFFICIENT ||
|---|---|---|---|
| | | a21 | b21 |
| 40 | y = 0.292143 x + 0.012286 | 0.292143 | 0.010810 |
| 42 | y = 0.325000 x + 0.011714 | 0.325000 | 0.011714 |
| 44 | y = 0.368571 x + 0.012571 | 0.368571 | 0.012571 |
| 46 | y = 0.412143 x + 0.013429 | 0.412143 | 0.013429 |
| 48 | y = 0.455714 x + 0.014286 | 0.455714 | 0.014286 |
| 50 | y = 0.499286 x + 0.015143 | 0.499286 | 0.015143 |
| 52 | y = 0.532143 x + 0.014571 | 0.532143 | 0.016002 |

Fig. 25

| FOCAL POSITION ($\mu$m) | PRIMARY APPROXIMATION FORMULA | COEFFICIENT | |
| --- | --- | --- | --- |
| | | a24 | b24 |
| -0.3 | y = -0.038500 x + 3.648000 | -0.038500 | 3.648000 |
| -0.2 | y = -0.033500 x + 3.512500 | -0.033500 | 3.512500 |
| -0.1 | y = -0.031000 x + 3.440000 | -0.031000 | 3.440000 |
| 0 | y = -0.030500 x + 3.416500 | -0.030500 | 3.416500 |
| 0.1 | y = -0.032500 x + 3.465000 | -0.032500 | 3.465000 |
| 0.2 | y = -0.036000 x + 3.549000 | -0.036000 | 3.549000 |
| 0.3 | y = -0.040964 x + 3.668357 | -0.040964 | 3.668357 |

| LINE LENGTH OF REMAINING PATTERN 201 | |
|---|---|
| AVG.= | 2.063 μm |
| MIN.= | 1.941 μm |
| MAX.= | 2.152 μm |

| LINE LENGTH OF REMAINING PATTERN 202 | |
|---|---|
| AVG.= | 2.047 μm |
| MIN.= | 2.003 μm |
| MAX.= | 2.085 μm |

METHOD FOR MANUFACTURING A SEMICONDUCTOR DEVICE

BACKGROUND OF THE INVENTION

1. Field of the Invention

The present invention relates to a method for manufacturing a semiconductor device, especially, a method for manufacturing a semiconductor device in which exposure conditions can be assessed by forming a predetermined assessment pattern on a principal surface of a semiconductor wafer.

In a photolithography process of manufacturing a semiconductor device, a resist pattern is formed by printing a circuit pattern, which is formed on a photo mask, on a semiconductor wafer with a reduced projection exposure device or a scanning reduced projection exposure device (hereinafter called an exposure device), after a photopolymer resin, a so called photoresist, is applied.

Recently, creating a high-quality resist pattern formed with photolithography has been an important issue, as large-scale integration and miniaturization of semiconductor devices are advanced. Quality of a resist pattern is normally assessed by its finished dimensions, especially its shape and its bottom dimensions. In order to form a good resist pattern, stabilization of the exposure conditions, that is, stabilization of the amount of exposure and focal position is essential. Therefore, a quantitative assessment of variations in the exposure conditions is required.

In a normal photolithography process, an exposure treatment is conducted for a product wafer in exposure conditions which were preliminarily assessed and set as optimal, so that the desired objective dimensions can be formed. However, the finished dimensions of a pattern is influenced by device variations or environmental variations when conducting an exposure treatment, such as the instability of the device itself and variations in the temperature or humidity surrounding a device. Therefore, all the patterns cannot be necessarily formed in the desired objective dimensions, even if the exposure conditions thought to be optimal are used. Because of this, at the start of manufacturing actual product wafers, single or plural wafer(s) may be processed in exposure conditions in advance and the conditions can be assessed before all the wafers of the product lot are processed. A predetermined exposure condition assessment pattern is used in order to check variation in these exposure conditions. The exposure condition assessment pattern is formed on every chip and it is independent from the circuit pattern of the primary integrated circuit on a chip. Variation in these exposure conditions is checked by measuring the dimensions of the exposure conditions assessment pattern of a wafer in advance that is processed in the exposure conditions that are thought to be optimal, and then by checking the difference between the actual dimensions of the pattern and its objective dimensions. If the difference is large, the amount of exposure and focal position need to be changed. Generally speaking, the relationship between the amount of exposure and the dimensions of a pattern shows linearity. Therefore, if the difference between the actual measured dimensions and the objective dimensions can be obtained, the amount of exposure that should be changed can be calculated. However, the relationship between the focal position and the dimensions of a pattern is generally represented by a substantially quadratic curve with an extremum at the optimal focal position. Therefore, two focal positions corresponding to specific pattern dimensions are detected, and thus it is impossible to judge whether a focal position has deviated to a positive dimensions or a negative size. Because of this, adjustment of the pattern dimensions is normally conducted only by changing the amount of exposure.

2. Background Information

For example, inventions of a manufacturing method of a semiconductor device in which assessment and adjustment of the exposure conditions are conducted are described in Japan Patent Publications JP-A-8-264409 (especially pages 7 and 8, and FIG. 1), JP-A-2003-168641 (especially pages 4-8, FIGS. 1, 2, and 6), and JP-A-2004-103674 (especially pages 9-20, FIG. 31).

In Japan Patent Publication JP-A-8-264409, a pair of removed patterns and a pair of remaining patterns whose corners face each other are formed on and under a step in a semiconductor wafer, respectively. Distance HA of a corner of a remaining pattern formed on a step, distance HB of a corner of a removed pattern, distance LA of a corner of a remaining pattern formed under a step, and distance LB of a corner of a removed pattern are measured, and the amount of exposure is assessed according to the value of HA+LA−HB−LB. Also, the focal position is assessed according to the value of HA+HB−LA−LB. Whether the amount of exposure and focal position in an exposure treatment of a semiconductor wafer is optimal or not is quantitatively assessed through these assessments.

In Japan Patent Publication JP-A-2003-168641, the exposure conditions are assessed with three exposure conditions assessment patterns. The first pattern is in a circular shape. The second pattern has the same shape and dimensions with the first pattern, but the height of the formed position is different from the first pattern. The third pattern has the same shape with the first pattern, but its dimensions and the height of the formed position are different from the first pattern. The dimensions of the first and the second patterns are set so that they are not influenced by the assumed difference in the focal position in an exposure process, and the dimensions of the third pattern is set so that it is influenced by the assumed difference of the focal position in an exposure process. Also, the amount of exposure and the focal position in the next exposure treatment is properly adjusted by preparing data in advance that indicates the relationship between the dimensions in forming each of the first to third patterns and the amount of exposure, and data that indicates the relationship between the dimensions and focal position, and then by estimating the variation in the amount of exposure, variation in focal position, and the varied direction of the focal point, with those prepared data and measured dimensions data of the first to third patterns formed in an actual manufacturing process.

In Japan Patent Publication JP-A-2004-103674, a method of adjusting the exposure conditions with a response surface method (RSM), which is a general statistical method, is described. First, in consideration of factors influencing the dimensions of a printed pattern, such as focus, amount of an exposure, mask pattern shape, and the differences in exposure devices including aberration, the response pattern dependence of the exposure conditions such as the best focus shift is assessed. Next, a response model including the differences in the pattern and the aberration of the device is created, and the availability and performance of the estimation of the exposure conditions with plural response models are assessed. Then, if a favorable assessment cannot be obtained from the results of the assessment, optimization in consideration of a control, such as a selection of a pattern, is conducted in setting the conditions. On the other hand, if a favorable assessment is obtained from the results of the assessment, device dimensions examination data is used for controlling feedback. Next, the exposure conditions at the start of manufacturing a device with each response model are estimated from the results of an examination of a plurality of actual device dimensions, and variation in the exposure conditions at the start of manufacturing a device is corrected with the estimation.

When the adjustment of the dimensions is conducted only by changing the amount of exposure, the difference in dimensions which originate from variation in focal position, is also dealt with by changing the amount of exposure. Therefore, there is a possibility that a negative impact will be encouraged by means of variation in focal position. In other words, variation in focal position not only influences an increase and decrease of pattern dimensions, but also makes variations in pattern dimensions sensitive toward variation in the amount of exposure. Thus, a method is required which can properly assess and adjust not only variation in the amount of exposure but also variation in the focal position.

The invention described in Japan Patent Publication JP-A-08-264409 is a method of assessing and adjusting variation in the amount of exposure and the focal position. However, a remaining pattern and a removed pattern need to be formed on and under a step, respectively. Therefore, there is a possibility that the area occupied by the exposure conditions assessment pattern will become large.

The invention described in Japan Patent Publication JP-A-2003-168641 is a method of assessing and adjusting variation in the amount of exposure and the focal position. However, there is a restriction in the dimensions of the exposure conditions assessment pattern. In other words, the dimensions of the first and second patterns need to be set so that they are not influenced by differences in focal position. Also, the dimensions of the third pattern are set so that it is influenced by differences in focal position. In general, the exposure conditions assessment pattern is desired to be formed in a small size to detect subtle variations in the exposure conditions. However, the first and second patterns of the invention need to be formed in a size such that they are not influenced by differences in focal point (e.g., 0.5 μm). If the first and second patterns are formed in a smaller size compared to that size, focal depth gets smaller, and it is expected that the first and second patterns tend to be easily influenced by differences in focal position.

In Japan Patent Publication JP-A-2004-103674, a method of assessing and adjusting variation in the amount of exposure and focal position is described. However, assessment and correction of the exposure conditions are conducted with a statistical method, RSM. Therefore, it can be seen that a complicated analysis method is required and the method cannot be easily put into operation.

In view of the above, it will be apparent to those skilled in the art from this disclosure that there exists a need for an improved method for manufacturing a semiconductor device. This invention addresses this need in the art as well as other needs, which will become apparent to those skilled in the art from this disclosure.

SUMMARY OF THE INVENTION

It is therefore an object of the present invention to resolve the above described problems and to provide a method for manufacturing a semiconductor device in which variation in the amount of exposure and focal position can be quantitatively assessed.

In accordance with the present invention, a method for manufacturing a semiconductor device in which exposure conditions can be assessed by forming a predetermined assessment pattern, and which includes a first assessment pattern comprised of a remaining pattern and a second assessment pattern comprised of a remaining pattern formed on a principal surface of a semiconductor wafer in a position lower than the first assessment pattern in an optical axis of an exposure device, is comprised of a preparation step and a manufacturing step of an actual semiconductor device. The preparation step includes the steps of forming a plurality of first assessment patterns and second assessment patterns on a principal surface of the first semiconductor wafer with a plurality of exposure conditions in which the amount of exposure and focal position are varied, measuring the dimensions of the first assessment pattern and the second assessment pattern, calculating a first difference and a first average between the measured dimensions of the first assessment pattern and the measured dimensions of the second assessment pattern that are formed with the same amount of exposure and the same focal position, and creating baseline data with respect to the exposure conditions based on the first difference and the first average. The manufacturing step of an actual semiconductor device includes the steps of forming the first assessment pattern and the second assessment pattern on a principal surface of a second semiconductor wafer with a predetermined amount of exposure and a focus position, measuring the dimensions of the first assessment pattern and the dimensions of the second assessment pattern, calculating a second difference and a second average between the measured dimensions of the first assessment pattern and the measured dimensions of the second assessment pattern, and assessing the exposure conditions by substituting the second difference and the second average for the baseline data and then calculating the actual amount of exposure and the actual focal position.

According to the method for manufacturing a semiconductor device of the present invention, two types of assessment patterns are used. They are formed by varying the amount of exposure and focal position for each shot of a first semiconductor wafer, and they are located in a position of different level of height. The two types of assessment patterns are a first assessment pattern and a second assessment pattern that is located lower than the first assessment pattern. Also, a first difference and a first average between the dimensions of the first assessment pattern and the dimensions of the second assessment pattern are measured, and the baseline data is obtained based on the measured data. For example, this occurs before all the wafers of the product lot are processed.

Actual exposure conditions that are varied because of various variation factors such as device variation and environmental variation can be calculated back by substituting the results of the measurement of the dimensions of the second semiconductor wafer that is processed in advance with predetermined exposure conditions that are thought to be optimal, that is, by substituting the results of the measurement of the second difference and the second average between the dimensions of the first assessment pattern and dimensions of the second assessment pattern, for the baseline data. In other words, actual exposure conditions can be calculated and assessed with the difference between the dimensions of the first assessment pattern and the dimensions of the second assessment pattern.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 6 shows a primary approximation formula and its coefficient (a11 and b11) expressing a relationship between focal position and the difference in pattern dimensions in a manufacturing method of a semiconductor device in accordance with the first embodiment of the present invention.

FIG. 10 is a primary approximation formula and its coefficient (a14 and b14) expressing a relationship between the amount of exposure and average value of a pattern in a manufacturing method of a semiconductor device in accordance with the first embodiment of the present invention.

FIG. 21 is a primary approximation formula and its coefficient (a21 and b21) that expresses the relationship between focal position and the difference in pattern dimensions in a manufacturing method of a semiconductor device in accordance with the second embodiment of the present invention.

FIG. 25 is a primary approximation formula and its coefficient (a24 and b24) expressing the relationship between the amount of exposure and the average value of a pattern in a manufacturing method of a semiconductor device in accordance with the second embodiment of the present invention.

DETAILED DESCRIPTION OF THE PREFERRED EMBODIMENTS

Figure 1A:
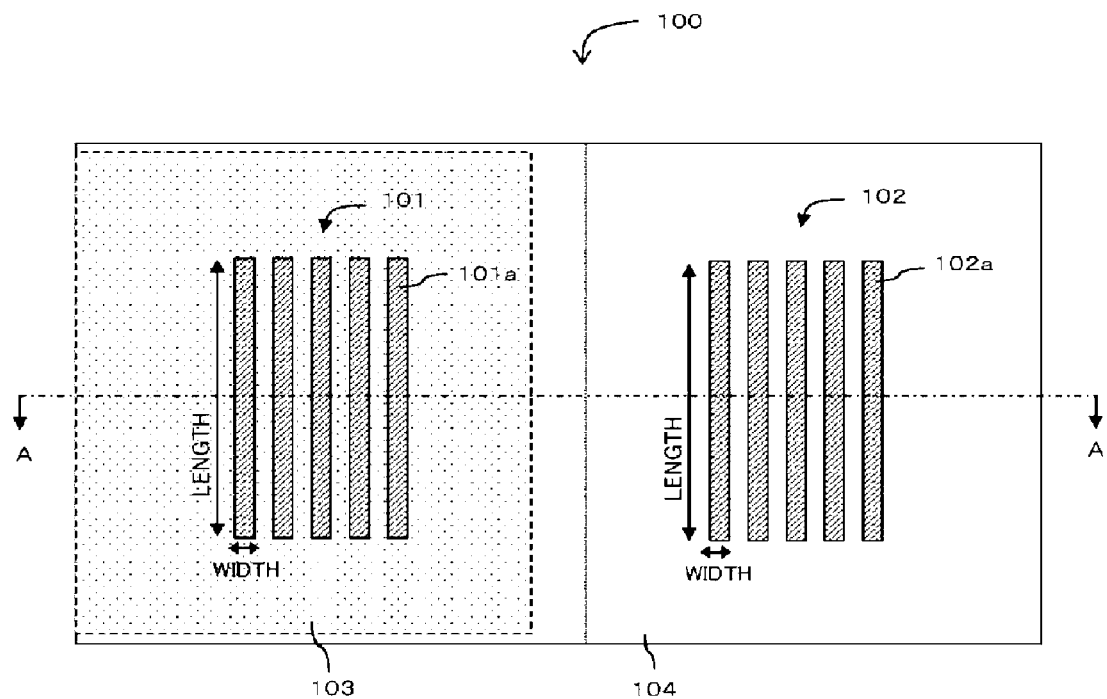
FIG. 1A and 1B show diagrams of a structure of an exposure conditions assessment pattern in accordance with the first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

Figure 1B:
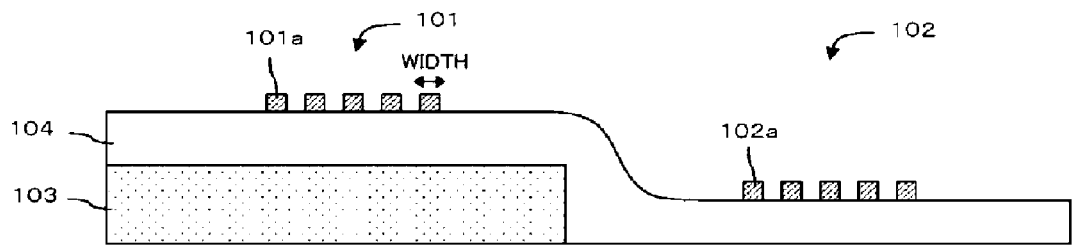

First, explanation of an exposure conditions assessment pattern is hereinafter provided. FIG. 1A and 1B show a structure of an exposure condition assessment pattern 100, which is used in a method for manufacturing a semiconductor device in accordance with the first embodiment of the present invention. FIG. 1A is a top view of the exposure conditions assessment pattern 100. FIG. 1B is a cross-section diagram of the exposure conditions assessment pattern 100 taken along line A-A'.

The exposure condition assessment pattern 100 includes a remaining pattern 101 in which a plurality of substantially rectangular line patterns 101a are formed in regular intervals and a remaining pattern 102 in which a plurality of substantially rectangular line patterns 102a are formed in regular intervals. The remaining patterns 101 and 102 are formed in the same shape, and the widths of line patterns 101a and 102a in the remaining patterns 101 and 102, respectively, are set to be the same dimensions. Here, the width of a line pattern 101a or 101b means the length of a shorter side of the substantially rectangular line pattern 101a or 101b, as shown in FIG. 1A. For example, the widths of line patterns 101a and 102a are set to be 0.16 μm in the first embodiment of the present invention. Also, as shown in FIG. 1B, a step pattern 103 is formed under the remaining pattern 101. For example, the height of the step pattern 103 is set to be 50-100 nm. The remaining pattern 101 is located higher than the remaining pattern 102 by means of the height of the step pattern 103. The step pattern 103 is formed in a process immediately before the process of forming a processed film 104, and the material used for the step pattern 103 is changed according to the structure of the assessed device or processes to be used. For example, if the processed film 104 is a metal wiring film, the step pattern 103 is formed by a silicon dioxide film that is an interlayer insulating film in a lower layer of a device. Also, the remaining patterns 101 and 102 are both resist patterns, and they are simultaneously formed on the surface of the processed film 104 with photolithography after the processed film 104 is formed. Also, the widths of the line patterns 101a and 102a are set to be 0.16 μm in the first embodiment of the present invention, but the widths can be changed properly according to the accuracy of measurement of the dimension measuring device to be used.

Explanation of the acquisition of baseline data is hereinafter provided. As described below, baseline data is basically acquired from each of the photolithography processes. However, if the same structure of a foundation is used and a pattern is formed under the same layout rule, common baseline data can be used in some photolithography processes. Also, baseline data that has already been acquired can be used for the same product wafer, that is, a wafer with the same device structure.

Figure 2:
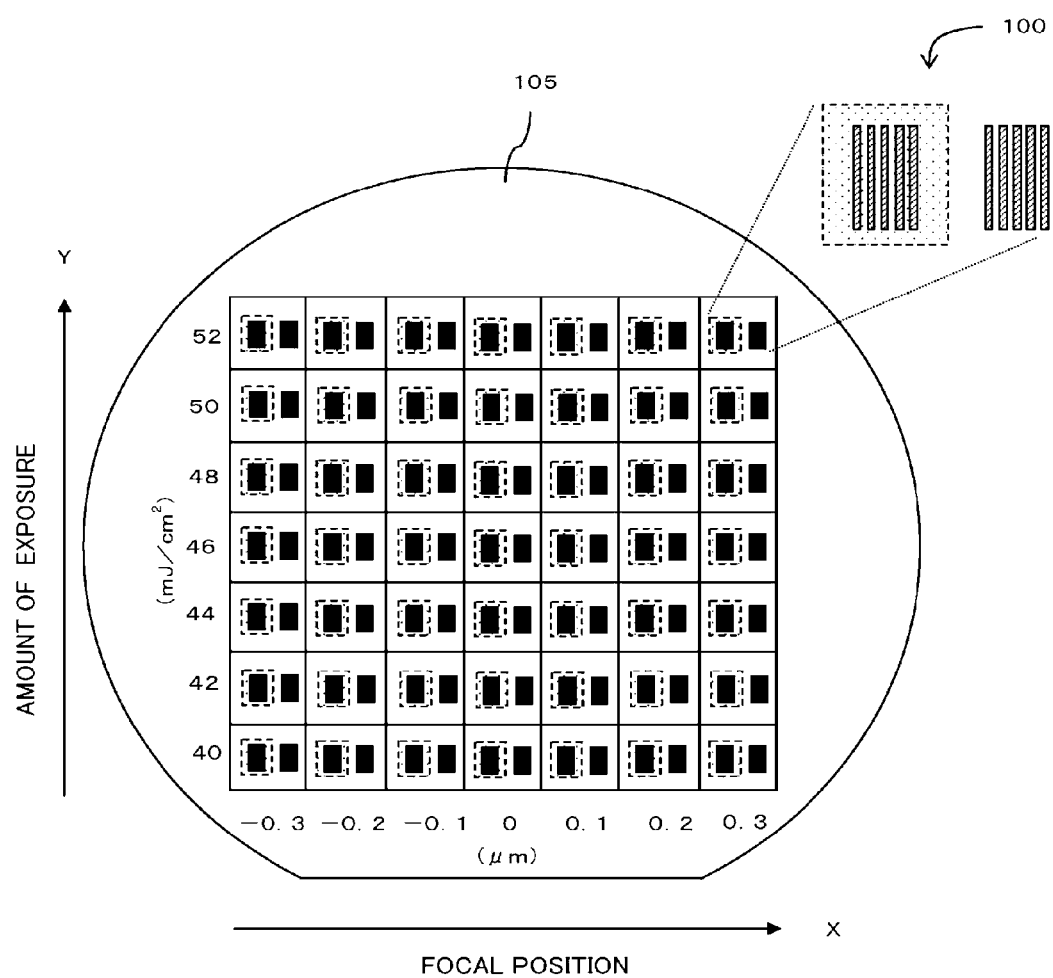
FIG. 2 shows a diagram of a shot layout of a semiconductor wafer including the exposure conditions assessment pattern used in a manufacturing method of a semiconductor device in accordance with the first embodiment of the present invention.

FIG. 2 is a diagram showing a layout of shots of an exposure on a semiconductor wafer 105 forming a semiconductor device. For example, the semiconductor wafer 105 has a 7×7 shot-layout of an exposure on its primary surface. An integrated circuit comprised of elements such as a transistor is formed on every shot, in other words, on every chip of a semiconductor wafer 105. Also, the exposure conditions assessment pattern 100 shown in FIG. 1, other than a circuit pattern that is a main portion of an integrated circuit, is formed on a predetermined position, such as an area in which a test element group (TEG) pattern for other process assessment is formed. Also, the exposure condition assessment pattern 100 is drawn in a large size in the center of every shot in FIG. 2. However, it does not reflect the actual layout dimensions. Also, a shot-layout of an exposure on the semiconductor wafer 105 is not limited to the 7×7 shot-layout.

First, one or more semiconductor wafer(s) 105 is/are taken from the product lot as an assessment wafer in order to obtain baseline data to calculate the amount of an exposure and a focal position in manufacturing product wafers. Then, resist patterns, that is, a circuit pattern that is a main portion of an integrated circuit and the exposure conditions assessment pattern 100, are simultaneously formed with different exposure conditions on every shot on a semiconductor wafer 105. At this time, the exposure conditions are set as follows. For example, as shown in FIG. 2, a different focal position which is expressed by the unit μm is allocated to every shot on a semiconductor wafer 105 along the "x" direction of a shot-layout on a semiconductor wafer 105. Also, a different amount of an exposure, which is expressed by unit mj/cm², is allocated to every shot on a semiconductor wafer 105 along the "y" direction on a shot-layout of a semiconductor wafer 105. For example, seven levels (scales) of a focal position are allocated along the x direction as −0.3, −0.2, −0.1, 0, 0.1, 0.2, and 0.3 μm in a left-to-right fashion as shown in FIG. 2. Also, seven levels (scales) of the amount of an exposure are allocated in the y direction as 40, 42, 44, 46, 48, 50, and 52 mJ/cm² from bottom up as shown in FIG. 2. The focal position and the amount of exposure hereinafter mean a predetermined value expressed by the unit μm and a predetermined value expressed by the unit mJ/cm², respectively.

Figure 3:
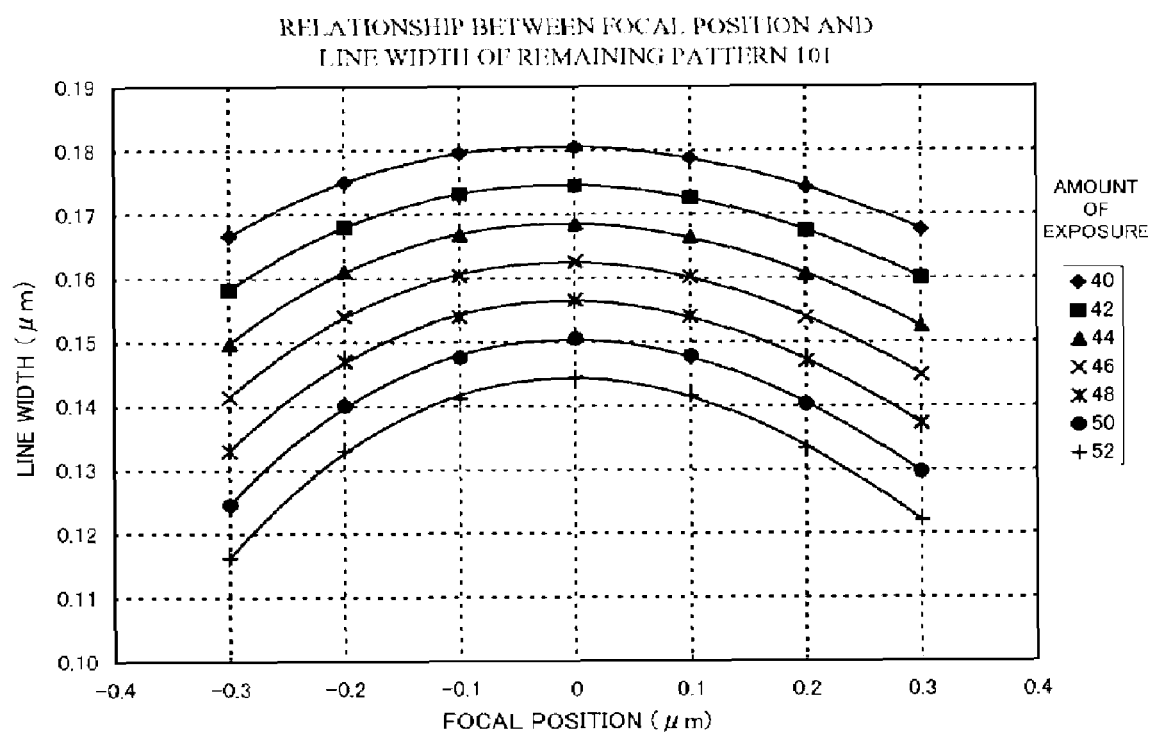
FIG. 3 shows a graph of the relationship between focal position and line width of a remaining pattern in a manufacturing method of a semiconductor device in accordance with the first embodiment of the present invention.
Figure 4:
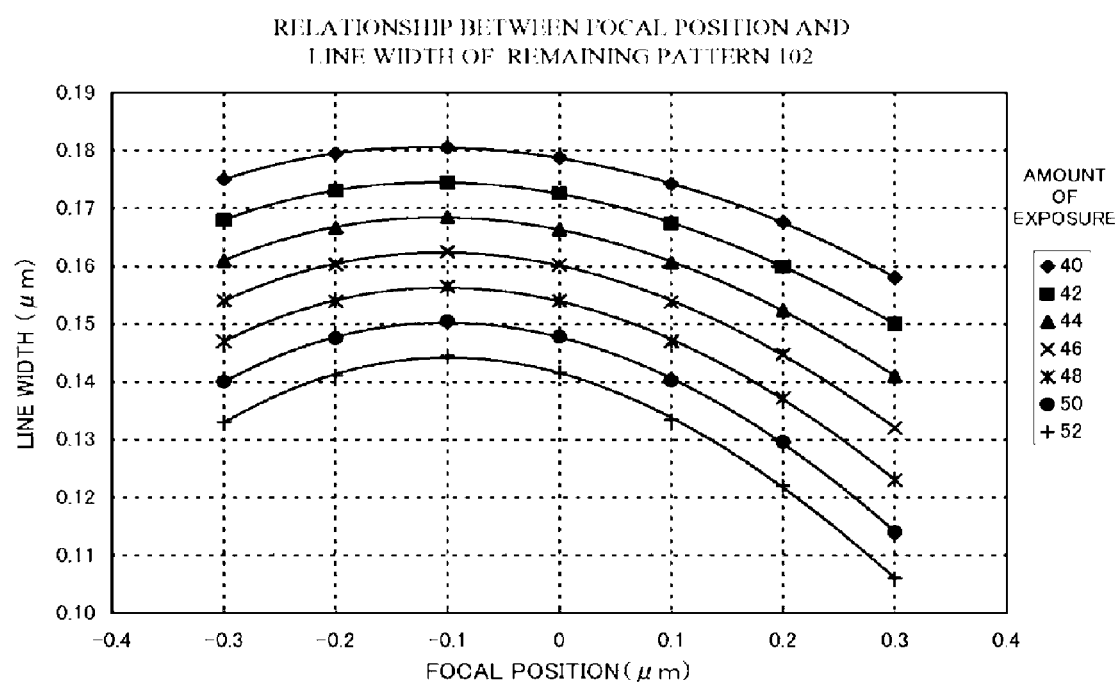
FIG. 4 shows a graph of the relationship between focal position and line width of a remaining pattern in a manufacturing method of a semiconductor device in accordance with the first embodiment of the present invention.

Next, the dimensions of the exposure conditions assessment pattern 100 formed on every shot with different exposure conditions, that is, the widths of line patterns 101a and 102a in the remaining patterns 101 and 102, respectively, are measured. FIG. 3 shows the relationship between the focal position and line width of the remaining pattern 101 (i.e., the line width of a line pattern 101a) with respect to each amount of exposure. As shown in FIG. 3, it can be seen that the relationship between a focal position and line width of the remaining pattern 101 is represented by a substantially quadratic curve with an extremum at a focal position 0 μm. FIG. 4 shows the relationship between the focal position and line width of the remaining pattern 102 (i.e., line width of a line pattern 102a) with respect to each amount of exposure. As shown in FIG. 4, it can be seen that the relationship between the focal position and line width of the remaining pattern 102 is represented by a substantially quadratic curve with an extremum that is apart from the focal position 0 μm in the negative direction. The difference between the extremums of the focal position is originated from the difference between the height of the remaining patterns 101 and 102.

Figure 5:
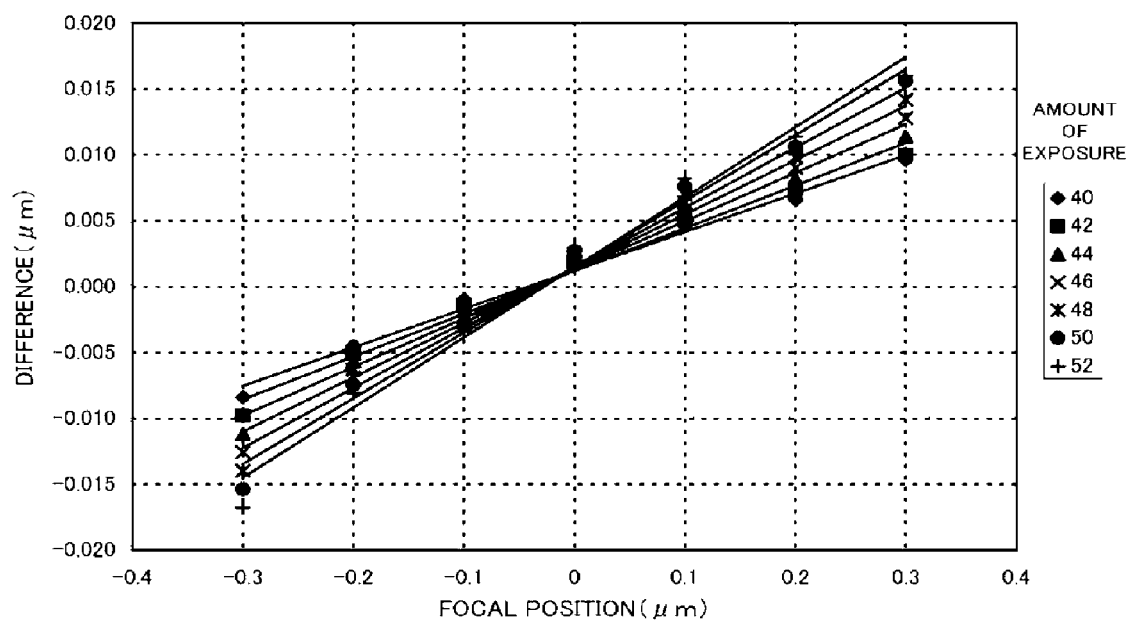
FIG. 5 shows a graph of the relationship between focal position and the difference between pattern dimensions in a manufacturing method of a semiconductor device in accordance with the first embodiment of the present invention.

Next, the difference between the line width of the remaining pattern 101 shown in FIG. 3 and that of the remaining pattern 102 shown in FIG. 4 is calculated with respect to the same amount of exposure and the same focal position. In other words, the difference between the line widths is calculated by the following formula: difference between widths= (line width of the remaining pattern 101)−(line width of the remaining pattern 102). FIG. 5 shows the relationship between the focal position and the difference between line widths with respect to each amount of exposure with an example of the exposure conditions shown in FIG. 2.

Next, primary approximation is conducted with respect to the result shown in FIG. 5, and a primary approximation formula (1) is derived for each amount of an exposure. Also, the difference between line widths and focal position are expressed by variable y and variable x, respectively.

$$y(\text{difference of line widths}) = a11 * x(\text{focal position}) + b11 \quad \text{Approximation formula (1)}$$

FIG. 6 shows the approximation formula (1) which is derived for each amount of an exposure and its coefficients a11 and b11 with an example of the exposure conditions shown in FIG. 2.

Figure 7:
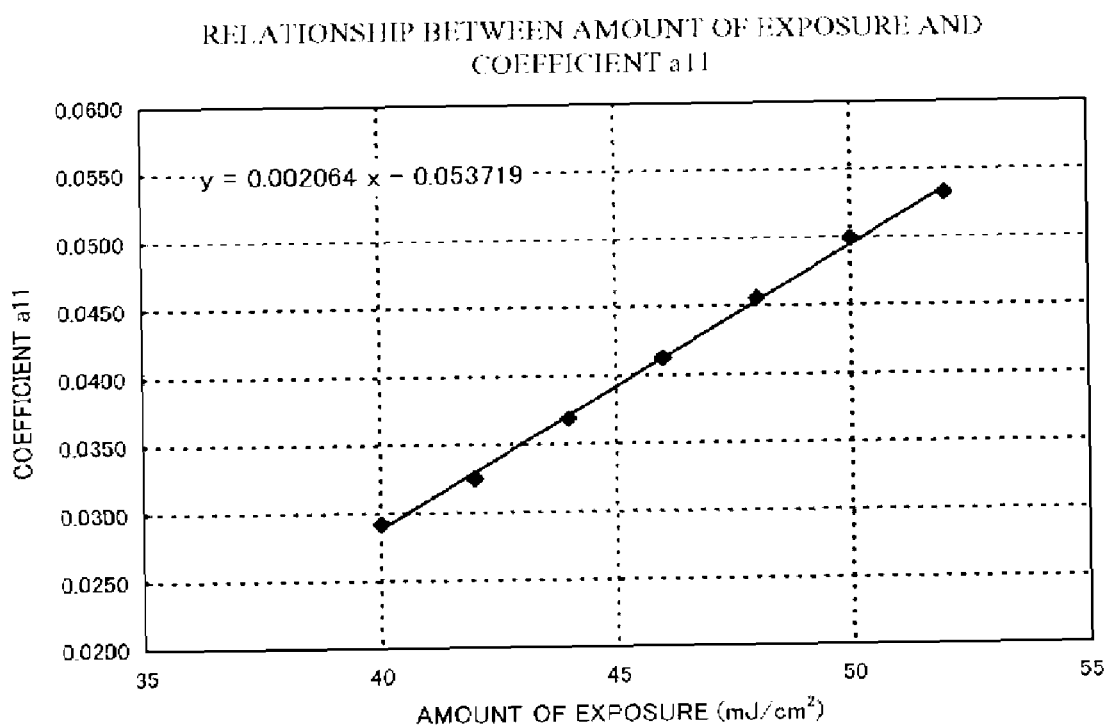
FIG. 7 shows a graph of the relationship between the amount of exposure and coefficient a11 in a manufacturing method of a semiconductor device in accordance with the first embodiment of the present invention.
Figure 8:
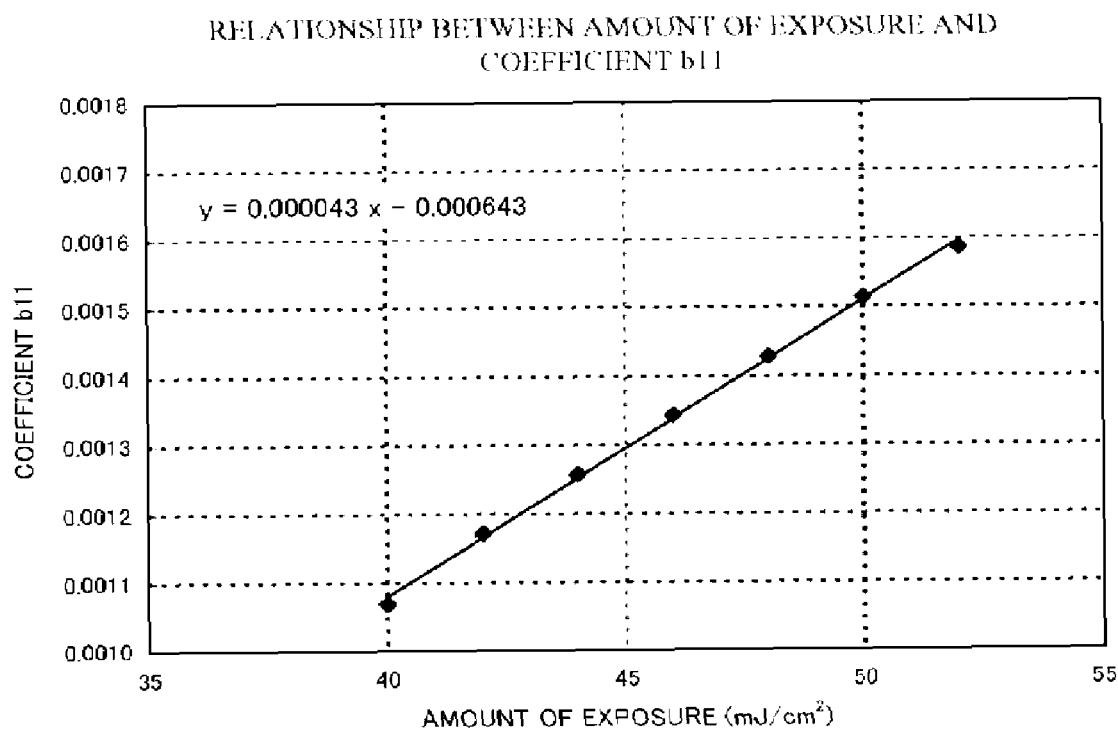
FIG. 8 shows a graph of the relationship between the amount of exposure and coefficient b11 in a manufacturing method of a semiconductor device in accordance with the first embodiment of the present invention.

Next, the relationship between the amount of an exposure and coefficient a11, and a relationship between the amount of an exposure and coefficient b11 are derived from the result shown in FIG. 6. FIG. 7 shows the relationship between the amount of an exposure and coefficient a11 with an example of the exposure conditions shown in FIG. 2. Also, FIG. 8 shows the relationship between the amount of an exposure and coefficient b11 with an example of the exposure conditions shown in FIG. 2.

Next, primary approximation is conducted for the results shown in FIG. 7, and an approximation formula (2) for coefficient a11 is derived. Also, primary approximation is conducted for the results shown in FIG. 8, and an approximation formula (3) for coefficient b11 is derived. Also, coefficient a11 is expressed by variable y, and the amount of an exposure is expressed by variable x in the approximation formula (2). Also, coefficient b11 is expressed by variable y, and the amount of an exposure is expressed by variable x in the approximation formula (3).

$$y(a11) = a12 * x(\text{amount of exposure}) + b12 \quad \text{Approximation formula (2)}$$

$$y(b11) = a13 * x(\text{amount of exposure}) + b13 \quad \text{Approximation formula (3)}$$

Figure 9:
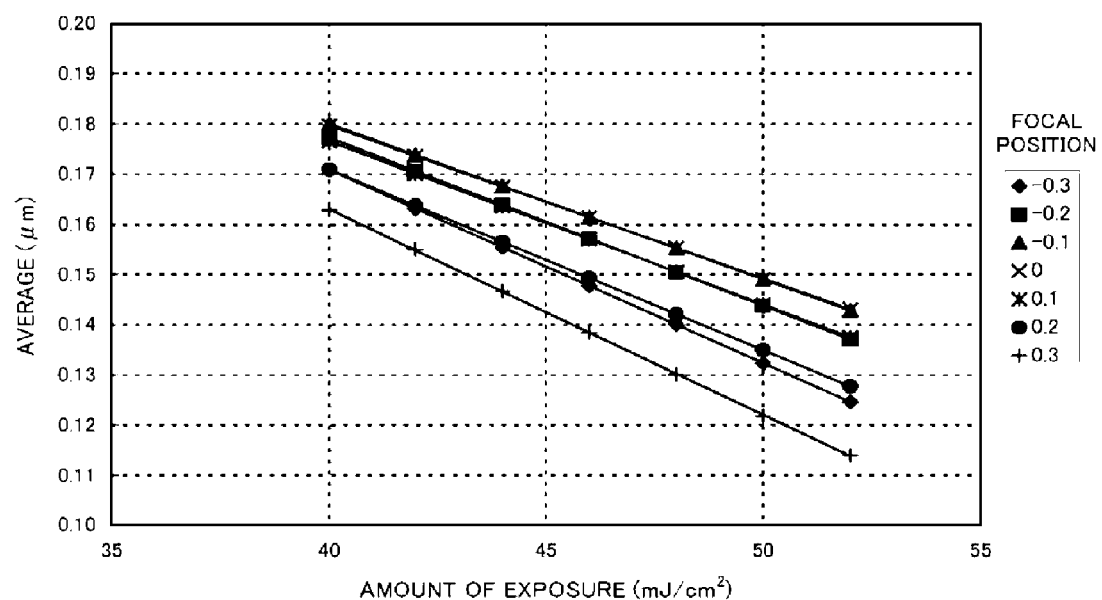
FIG. 9 shows a graph of the relationship between the amount of exposure and the average value of a pattern in a manufacturing method of a semiconductor device in accordance with the first embodiment of the present invention.

Next, the average of line width of the remaining pattern 101 shown in FIG. 3 and line width of the remaining pattern 102 shown in FIG. 4 is calculated with respect to the same amount of exposure and focal position. In other words, the average is calculated by the following formula: average=[(line width of the remaining pattern 101)+(line width of the remaining pattern 102)]/2. FIG. 9 shows the relationship between the amount of an exposure and the average of the line widths with respect to each focal position with an example of the exposure conditions shown in FIG. 2.

Next, primary approximation is conducted for the results shown in FIG. 9, and an approximation formula (4) is derived with respect to each focal position. Also, the average of line widths is expressed by variable y, and the amount of exposure is expressed by variable x in the approximation formula (4).

$$y(\text{average}) = a14 * x(\text{amount of exposure}) + b14 \quad \text{Approximation formula (4)}$$

FIG. 10 shows the approximation formula (4) which is derived with respect to each focal position and its coefficients a14 and b14 with an example of the exposure conditions shown in FIG. 2.

Figure 11:
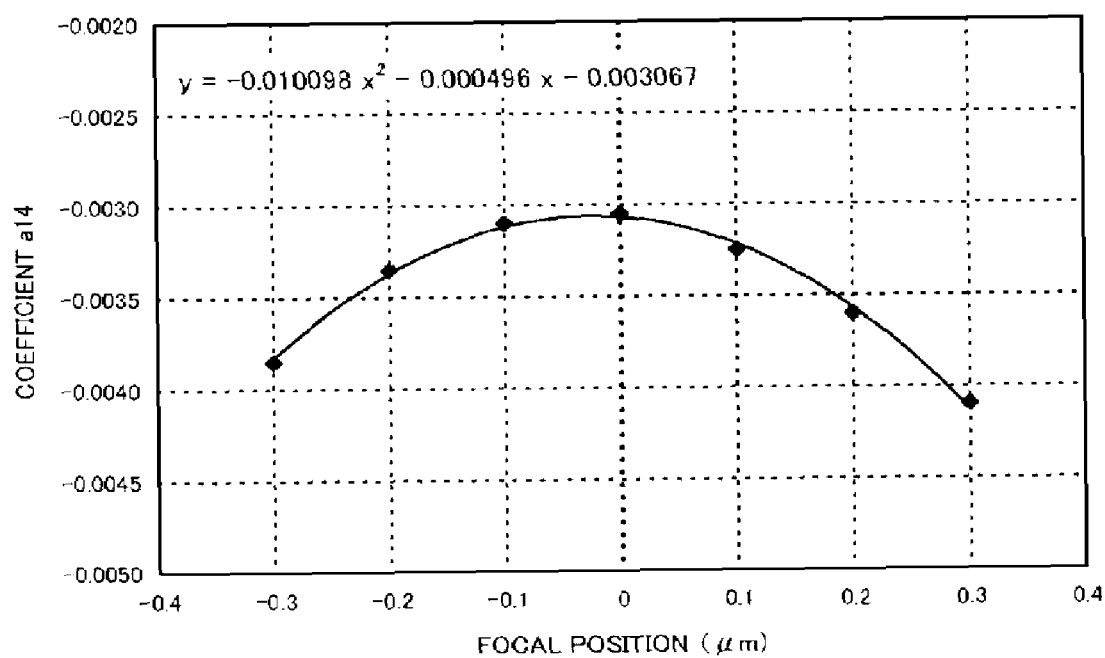
FIG. 11 shows a graph of the relationship between focal position and coefficient a14 in a manufacturing method of a semiconductor device in accordance with the first embodiment of the present invention.
Figure 12:
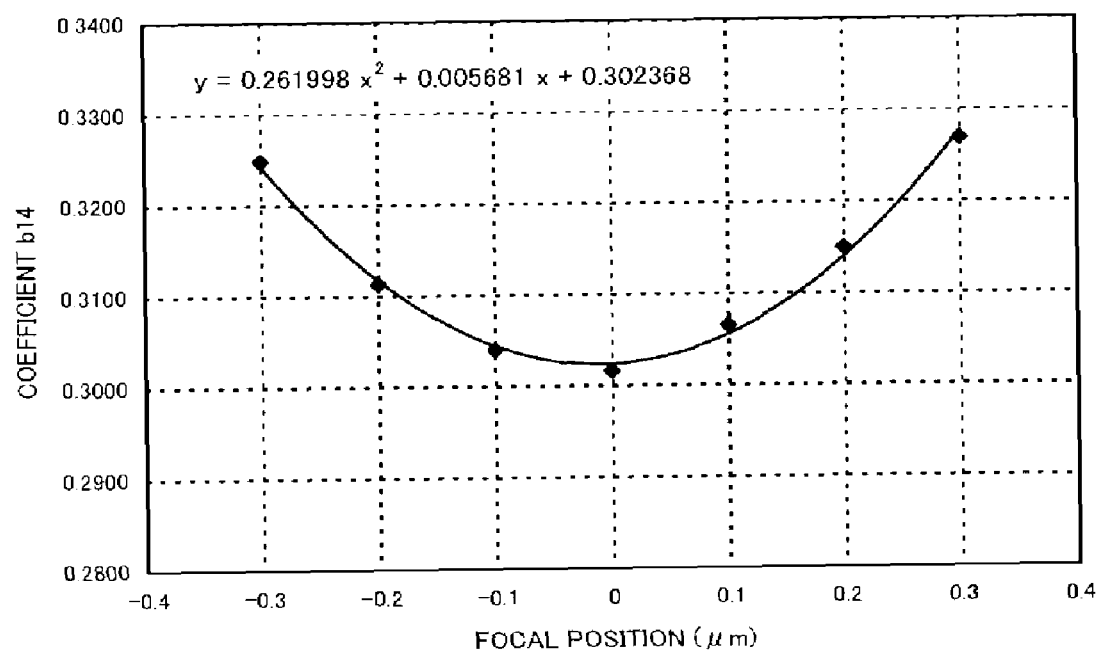
FIG. 12 shows a graph of the relationship between focal position and coefficient b14 in a manufacturing method of a semiconductor device in accordance with the first embodiment of the present invention.

Next, the relationship between the focal position and coefficient a14 and the relationship between the focal position and coefficient b14 are derived from the result shown in FIG. 10. FIG. 11 shows the relationship between the focal position and coefficient a14 with an example of the exposure conditions shown in FIG. 2. Also, FIG. 12 shows the relationship between the focal position and coefficient b14 with an example of the exposure conditions shown in FIG. 2.

Next, secondary approximation is conducted for the results shown in FIG. 11, and an approximation formula (5) for coefficient a14 is derived. Also, secondary approximation is conducted for the results shown in FIG. 12 and an approximation formula (6) for coefficient b14 is derived. Also, coefficient a14 is expressed by variable y, and the focal position is expressed by variable x in the approximation formula (5). Also, coefficient b14 is expressed by variable y, and the focal position is expressed by variable x in the approximation formula (6).

$$y(a14) = a15 * x(\text{focal position})^2 + b15 * x(\text{focal position}) + c15 \quad \text{Approximation formula (5)}$$

$$y(b14) = a16 * x(\text{focal position})^2 + b16 * x(\text{focal position}) + c16 \quad \text{Approximation formula (6)}$$

The amount of exposure and the focal position at the start of manufacturing products are calculated and assessed based on baseline data comprised of approximation formulas (2), (3), (5), and (6).

An explanation of the calculation of the exposure conditions is hereinafter provided. At the start of manufacturing product wafers, an exposure treatment is normally conducted with the exposure conditions that are thought to be optimal and are set in advance based on an examination of various exposure conditions, so that the desired objective dimensions can be obtained. However, the finished dimensions of a pattern are influenced by variations in a device or variations in the environment when conducting an exposure treatment, such as the instability of the device itself and the temperature or humidity surrounding a device. Therefore, all patterns cannot be necessarily formed with the desired objective dimensions, even if the exposure conditions that are thought to be optimal are used. Because of this, at the start of manufacturing actual product wafers, the exposure conditions may be checked by processing one or more wafer(s) in advance (hereinafter called the pre-processing exposure conditions) before all the wafers of the product lot are processed. In this case, the exposure conditions are assessed based on the calculation of variations in the exposure conditions with the baseline data comprised of approximation formulas (2), (3), (5), and (6).

First, the amount of exposure that was used in the pre-processing, that is, the amount of exposure that is thought to be optimal at the time, is substituted for x (the amount of exposure) in approximation formulas (2) and (3) as the provisional amount of exposure. As a result of this, coefficients y(a11) and y(b11) can be obtained. The coefficients y(a11) and y(b11) are used as coefficients a11 and b11 in the approximation formula (1), respectively. Because of this, the approximation formula (1) can be transformed to a formula (7).

$$y(\text{difference between widths}) = y(a11) * x(\text{focal position}) + y(b11) \quad \text{Formula (7)}$$

Furthermore, the formula (7) can be transformed to a formula (8).

$$x(\text{focal position}) = [y(\text{difference between line widths}) - y(b11)] / y(a11) \quad \text{Formula (8)}$$

In the formula (8), the difference between line widths is expressed by variable y, and the focal position is expressed by variable x. Therefore, an actual focal position can be calculated by substituting the difference between the line widths that are obtained by measurement of the widths in a wafer in which pre-processing is actually conducted, that is, the difference between line widths that is obtained by measurement of the line widths of line pattern 101a in the remaining pattern 101 and that of line pattern 102a in the remaining pattern 102, for variable y (difference between widths) in the formula (8).

Next, the focal position obtained in the formula (8) is substituted for variable x (focal position) in approximation formulas (5) and (6). As a result, coefficients y(a14) and y(b14) can be obtained. The coefficients y(a14) and y(b14) are used as coefficients a14 and b14 in the approximation formula (4), respectively. Because of this, the approximation formula (4) can be transformed to an approximation formula (9).

$$y(\text{average})=y(a14)*x(\text{amount of exposure})+y(b14) \quad \text{Formula (9)}$$

Furthermore, the formula (9) can be transformed to a formula (10).

$$x(\text{amount of exposure})=[y(\text{average})-y(b14)]/y(a14) \quad \text{Formula (10)}$$

In the formula (10), the average is expressed by variable y, and the amount of exposure is expressed by variable x. Therefore, the actual amount of an exposure can be calculated by substituting the average obtained by measurement of the line widths in a wafer that is actually processed in advance, that is, the average obtained by measurement of the line widths of line pattern 101a in the remaining pattern 101 and that of the line pattern 102a in the remaining pattern 102, for variable y (average) in the formula (10).

The following is an actual example of the calculation and assessment of the exposure conditions in the first embodiment of the present invention.

Explanation of the acquisition of baseline data is hereinafter provided. First, one or more semiconductor wafer(s) 105 was/were taken from the product lot as an assessment wafer(s) in order to obtain baseline data to calculate the amount of exposure and the focal position at the start of manufacturing the product wafers. Then, a resist pattern, that is, the exposure conditions assessment pattern 100, was formed with the exposure conditions shown in FIG. 2.

Next, the dimensions of the exposure condition assessment pattern 100 that was formed in every shot with different exposure conditions, that is, the line widths of a line pattern 101a in the remaining pattern 101 and a line pattern 102a in the remaining pattern 102, was measured. FIG. 3 shows the relationship between the focal position and line width of the remaining pattern 101 with respect to each amount of exposure. Also, FIG. 4 shows the relationship between the focal position and line width of the remaining pattern 102 with respect to each amount of exposure.

Next, the difference between the line widths of the remaining pattern 101 shown in FIG. 3 and the remaining pattern 102 shown in FIG. 4 is calculated. FIG. 5 shows the relationship between focal position and the difference between line widths with respect to each amount of exposure.

Next, primary approximation is conducted for the result shown in FIG. 5. Then, an approximation formula (1) and its coefficients a11 and b11 are derived for each amount of exposure. FIG. 6 shows the approximation formula (1) and its coefficients a11 and b11 derived for each amount of exposure.

Next, the relationship between the amount of exposure and coefficient a11, and the relationship between the amount of exposure and coefficient b11, are derived from the results shown in FIG. 6. FIG. 7 shows the relationship between the amount of exposure and coefficient a11. Also, FIG. 8 shows the relationship between the amount of exposure and coefficient b11.

Next, primary approximation is conducted for the results shown in FIG. 7, and an approximation formula (2)' for coefficient a11 is derived. Also, primary approximation is conducted for the results shown in FIG. 8, and an approximation formula (3)' for coefficient b11 is derived.

$$y(a11)=0.002064*x(\text{amount of exposure})-0.053719 \quad \text{Approximation formula (2)'}$$

$$y(b11)=0.000043*x(\text{amount of exposure})-0.000643 \quad \text{Approximation formula (3)'}$$

Next, the average line width of the remaining pattern 101 shown in FIG. 3 and the line width of the remaining pattern 102 shown in FIG. 4 is calculated with respect to the same amount of exposure and focal position. FIG. 9 shows the relationship between the amount of exposure and the average line widths with respect to each focal position.

Next, primary approximation was conducted for the results shown in FIG. 9, and an approximation formula (4) was derived with respect to each focal point and coefficients a14 and b14 were derived. FIG. 10 shows the approximation formula (4) derived with respect to each focal point and its coefficients a14 and b14.

Next, the relationship between focal position and coefficient a14, and the relationship between focal position and coefficient b14 are derived from the results shown in FIG. 10, respectively. FIG. 11 shows the relationship between focal position and coefficient a14. Also, FIG. 12 shows the relationship between focal position and coefficient b14.

Next, secondary approximation is conducted for the results shown in FIG. 11, and an approximation formula (5)' for coefficient a14 is derived. Also, secondary approximation is conducted for the results shown in FIG. 12, and an approximation formula (6)' for coefficient b14 is derived.

$$y(a14)=-0.010098*x(\text{focal position})^2-0.000496*x(\text{focal position})-0.003067 \quad \text{Approximation formula (5)'}$$

$$y(b14)=0.261998*x(\text{focal position})^2+0.005681*x(\text{focal position})+0.302368 \quad \text{Approximation formula (6)'}$$

The exposure conditions are assessed based on the calculation of the amount of exposure and focal position at the start of manufacturing products with baseline data comprised of the above described approximation formulas (2)', (3)', (5)', and (6)'.

Figure 13:
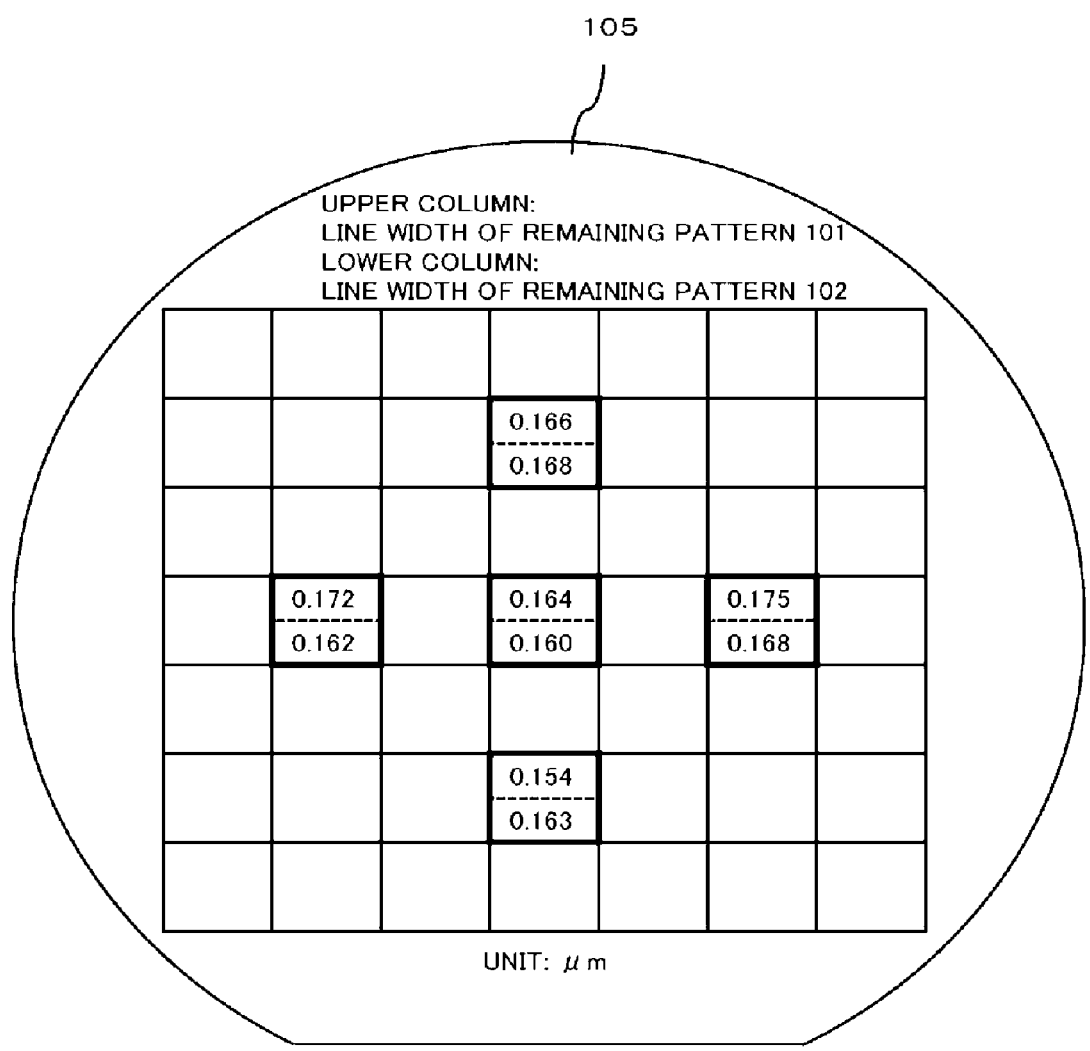
FIG. 13 shows the results of measuring the dimensions of the exposure conditions assessment pattern used in a manufacturing method of a semiconductor device in accordance with the first embodiment of the present invention.
Figure 14:
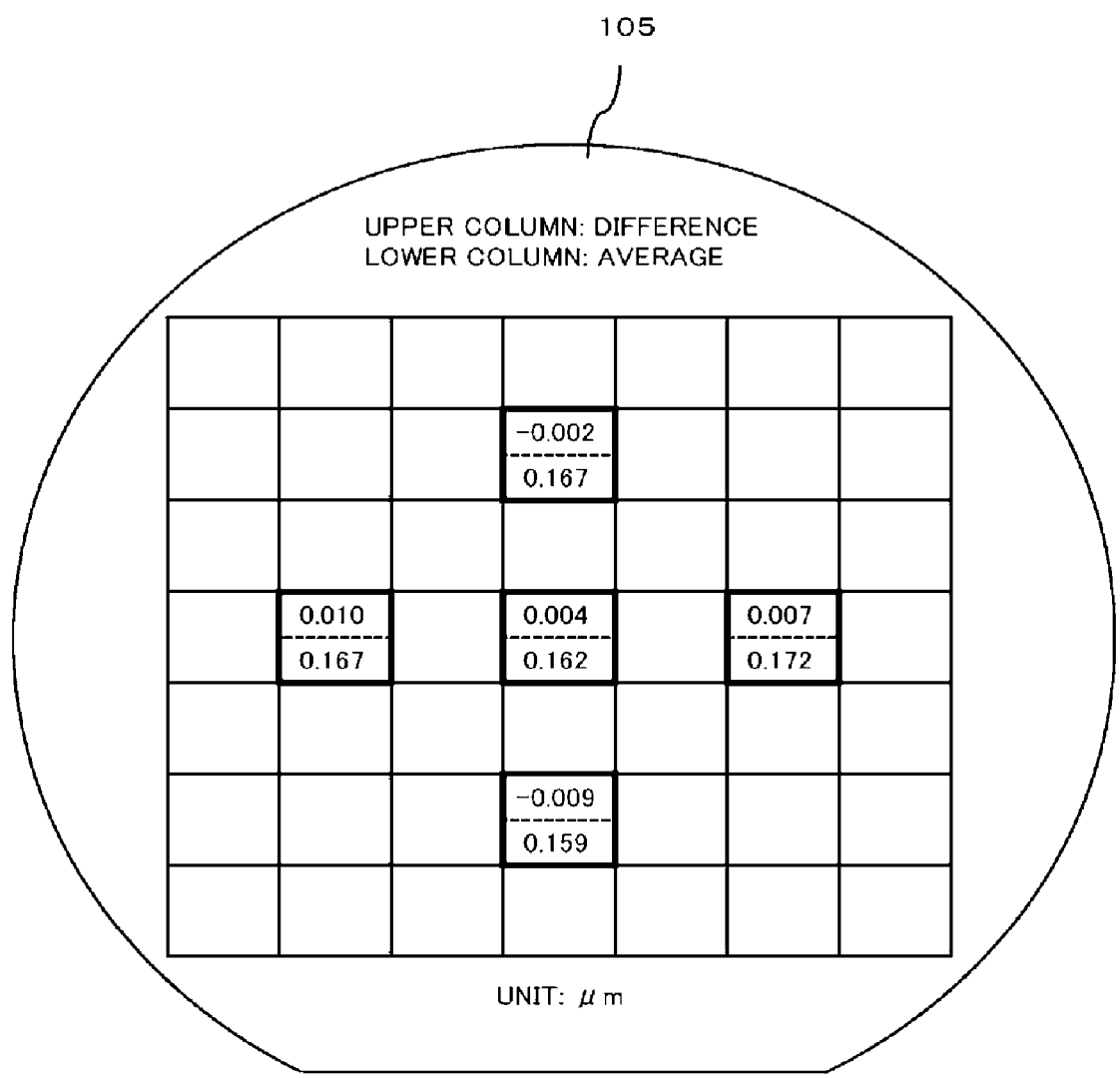
FIG. 14 shows the results of measuring the differences in the dimensions and average of the exposure conditions assessment pattern used in a manufacturing method of a semiconductor device in accordance with the first embodiment of the present invention.

An example of the calculation of the exposure conditions is hereinafter provided. FIG. 13 shows the results of the measurement of line width in the semiconductor wafer 105 that is processed in advance in the exposure conditions that are thought to be optimal. More specifically, the figure shows the results of the measurement of the line width of the line pattern 101a in the remaining pattern 101 in an upper column of each shot, and also shows the results of the measurement of the line width of the line pattern 102a in the remaining pattern 102 in a lower column of each shot. Also, the measurement of line width is conducted for 5 shots shown in FIG. 13 in the semiconductor wafer 105 with a 7×7 shot-layout. Also, FIG. 14 shows the difference and average that were calculated between the line width of the remaining pattern 101 and that of the remaining pattern 102 in an upper column and a lower column of a shot, respectively, based on the results of the measurement shown in FIG. 13.

Here, the exposure conditions are calculated for a shot located in the center of the five shots (hereinafter called a center shot) on the semiconductor wafer 105. As shown in FIG. 13, the line widths of the remaining pattern 101 in the center shot on the semiconductor wafer 105 and the remaining pattern 102 are 0.164 and 0.160 µm, respectively. Also, as shown in FIG. 14, the difference between line widths of the remaining pattern 101 and the remaining pattern 102 is 0.004 µm, and the average of the line widths of the remaining pattern 101 and the remaining pattern 102 is 0.162 μm. Also, the exposure conditions of this pre-processing are set as follows. That is, the amount of exposure is set to be 44.0 mJ/cm$^2$, and the focal position is set to be +0.05 μm.

First, the amount of exposure 44.0 mJ/cm$^2$ that is used in the pre-processing is substituted variable x (amount of exposure) in both the approximation formulas (2)' and (3)' as a provisional amount of exposure. As a result, coefficients a11 and b11 are derived as follows.

Coefficient a11=0.002064*44.0−0.05371 9=0.037097

Coefficient b11=0.000043*44.0−0.000643=0.001 249

Next, the coefficients a11 and b11 are substituted for variables y(a11) and y(b11) in the approximation formula (8) that is used to derive the focal position, respectively. Also, 0.0004 μm is substituted for variable y (difference in dimensions) in the approximation formula (8). As a result, a provisional focal position is derived as follows.

Provisional focal position=(0.004−0.001249)/0.037097=+0.074 μm

Next, this provisional focal position is substituted for variable x (focal position) in the approximation formulas (5)' and (6)'. As a result, coefficients a14 and b14 are derived as follows.

Coefficient a14=−0.010098*0.0742−0.000496*0.0074−0.003067=−0.003159

Coefficient b14=0.261998*0.0742+0.005681*0.074+0.302368=0.304223

Next, the coefficients a14 and b14 are substituted for variables y(a14) and y(b14) in the approximation formula (10) that is used to derive the amount of exposure. Also, 0.162 μm is substituted for variable y (average) in the approximation formula (10). As a result, the actual amount of exposure whose conditions are varied because of various variation factors such as device variation and environmental variation is derived as follows.

Actual amount of exposure=(0.162−0.304223)/(−0.003159)=45.0 mJ/cm$^2$

The provisional focal position is calculated with a provisional amount of exposure. Therefore, the actual focal position whose condition is varied is calculated with the actual amount of exposure once again. Coefficients a11 and b11 are calculated as follows by substituting the newly calculated amount of exposure 45.0 mJ/cm$^2$ for variable x (amount of exposure) in the approximation formulas (2)' and (3)'.

Coefficient a11=0.002064*45.0−0.053719=0.039161

Coefficient b11=0.000043*45.0−0.000643=0.001 292

The coefficients a11 and b11 are substituted for variables y(a11) and y(b11) in the approximation formula (8) that is used to derive focal position. Also, 0.004 μm is substituted for variable y (difference of line widths) in the approximation formula (8). As a result, the actual focal position is derived as follows.

Actual focal position=(0.004−0.001292)/0.039161=+0.0069 μm

Thus, the actual exposure conditions that are varied because of various variation factors such as device variation and environmental variation, that is, the actual amount of exposure 45.0 mJ/cm$^2$ and the actual focal position +0.069 μm can be calculated back, by measuring the line widths of the remaining patterns 101 and 102 formed with the amount of exposure 44.0 mJ/cm$^2$ and the focal position +0.05 μm, calculating the difference and average of the line widths of the remaining patterns 101 and 102, and then substituting the difference and the average for variables in the approximation formulas of baseline data (2)', (3)', (5)' and (6)'. In other words, the actual exposure conditions can be calculated from the difference in the line widths of the remaining patterns 101 and 102.

Figure 15:
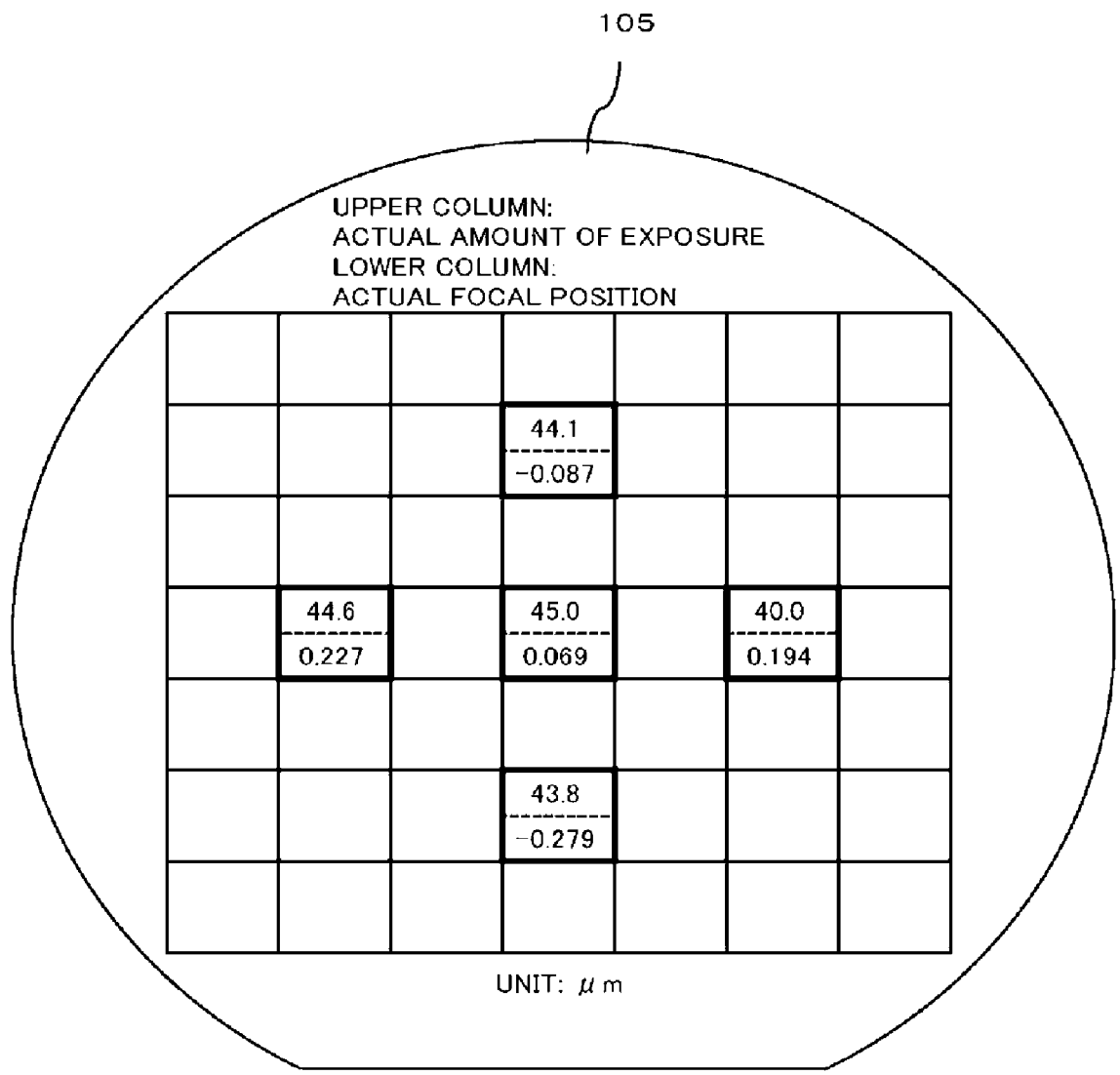
FIG. 15 shows a diagram of the actual exposure conditions calculated in a manufacturing method of a semiconductor device in accordance with the first embodiment of the present invention.

As described above, the actual exposure conditions, which are varied because of various variation factors, is calculated with respect to the center shot on the semiconductor wafer 105. FIG. 15 shows the results of the calculation of the actual exposure conditions with respect to five shots shown in FIG. 13 with the above described method. FIG. 15 shows the actual amount of exposure of each of five shots in an upper column of the shot, and it also shows the actual focal position of each of five shots in a lower column of the shot. Form the results shown in FIG. 15, the average of the actual amount of exposure of 5 shots is calculated to be 43.5 mJ/cm$^2$ and the average of the actual focal positions of 5 shots is calculated to be +0.025 μm. For example, the results of these calculations can be used as follows. First, a pattern can be formed with dimensions that are closer to the objective dimensions at the start of manufacturing the product wafers by fine-adjusting the exposure conditions with the actual amount of exposure and the actual focal position that are calculated as average on a surface of the semiconductor wafer 105. Second, the stability of an exposure device can be assessed, and adjustment and correction of an exposure device itself can be conducted by assessing the trend of variation in the exposure conditions on a surface of a wafer with the actual amount of exposure and the actual focal position that are calculated for each of the shots of the semiconductor wafer 105, such as 5 shots shown in FIG. 13.

According to the first embodiment of the present invention, two types of resist pattern located at different level of height are used, and they are formed by changing the amount of exposure and the focal position for each of the shots of the semiconductor wafer 105. The two types of resist pattern are the remaining pattern 101 that is formed on the step pattern 103 and the remaining pattern 102 that is formed lower than the remaining pattern 101 by the step pattern 103. Also, the difference and average of the line widths of the line patterns 101a and 102a in the remaining patterns 101 and 102, respectively, are measured, and baseline data is obtained based on these measured results. Also, before all the wafers of the product lot are processed, actual exposure conditions that are varied because of various variation factors such as device variation and environmental variation can be calculated back by substituting the results of the measurement of the dimensions of the semiconductor device 105 that was processed in advance with the exposure conditions that are thought to be optimal, that is, by substituting the results of the difference and the average of line widths of line patterns 101a and 102a in the remaining patterns 101 and 102, respectively, for variables in an approximation formula of baseline data. In other words, it is possible to calculate and assess the actual exposure conditions based on the difference in the line widths of the remaining patterns 101 and 102.

Second Embodiment

Figure 16A:
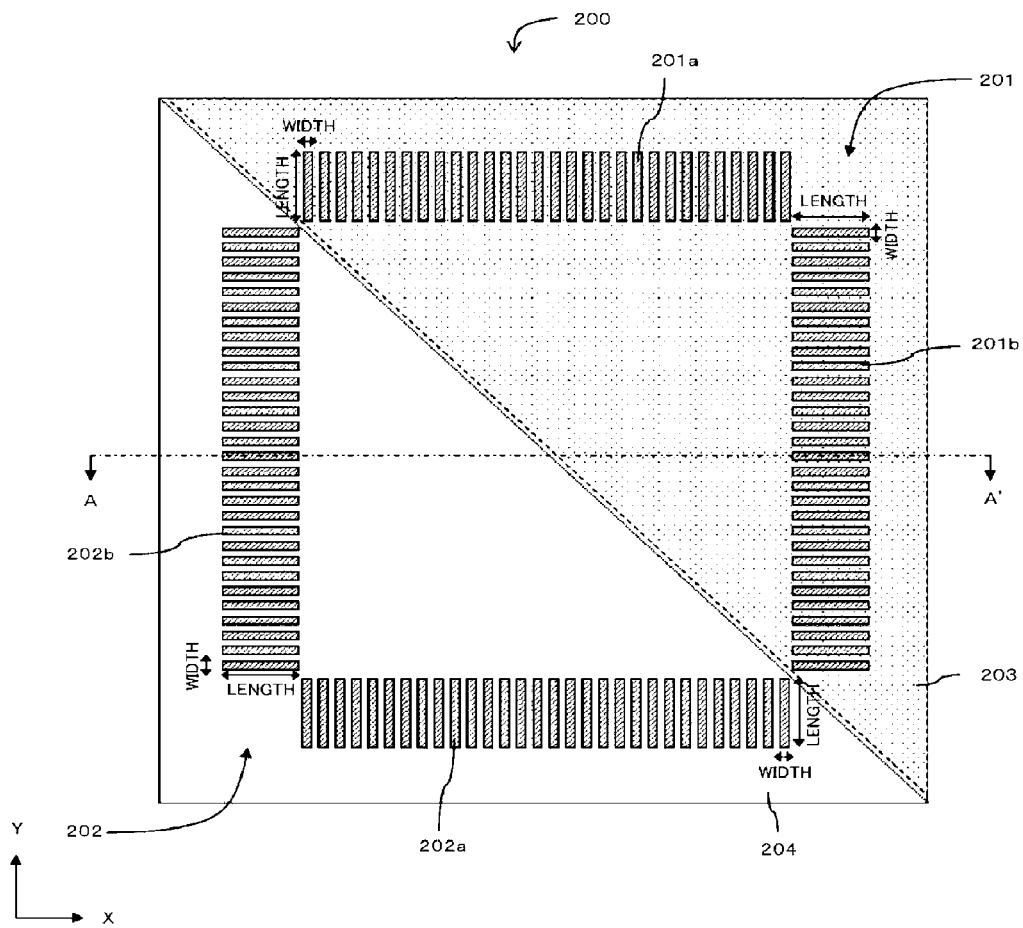
FIGS. 16A and 16B show the structure of an exposure conditions assessment pattern in accordance with the second embodiment of the present invention.
Figure 16B:
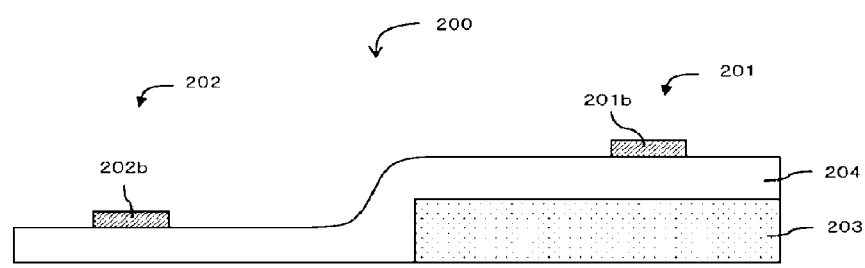

First, explanation of the exposure conditions assessment pattern is herein provided. FIGS. 16A and 16B show a structure of the exposure conditions assessment pattern 200, which is used in a method for manufacturing a semiconductor device in accordance with the second embodiment of the present invention. FIG. 16A is a top view of the exposure conditions assessment pattern 200. FIG. 16B is a cross-section diagram of the exposure conditions assessment pattern 200 taken along line A-A'.

The exposure condition assessment pattern 200 includes a remaining pattern 201 in which a plurality substantially rectangular line patterns 201a and 201b are formed in regular intervals and a remaining pattern 202 in which a plurality of substantially rectangular line patterns 202a and 202b are formed in regular intervals. The line patterns 201a and 201b are formed on a processed film 204 at right angles to each other. The line pattern 201a is located along the "y" direction and the line pattern 201b is located along the "x" direction as shown in FIG. 16A. Also, the line patterns 202a and 202b are formed on the processed film 204 at right angles to each other. The line pattern 202a is located along the "x" direction and the line pattern 202b is located along the "y" direction. In other words, the line patterns 201a and 202a face in parallel, and the line patterns 201b and 202b face in parallel. The remaining patterns 201 and 202 are formed in the same shape. Also, the width and length of line patterns 201a and 201b in the remaining pattern 201 and those of line patterns 202a and 202b in the remaining pattern 202 are set to be the same. Here, "width of a line pattern" means the length of the shorter side of the substantially rectangular line pattern 201a, 201b, 202a, or 202b as shown in FIG. 16A. Also, "length of a line pattern" means the length of the longer side of the substantially rectangular line pattern 201a, 201b, 202a, or 202b as shown in FIG. 16A. For example, the widths of the line patterns 201a and 201b are set to be 0.16 μm, and the lengths of the line patterns 201a and 201b are set to be 2.00 μm in the second embodiment of the present invention. Also, the widths of line patterns 202a and 202b are set to be 0.16 μm, and the lengths of line patterns 202a and 202b are set to be 2.00 μm in the second embodiment of the present invention. Also, as shown in FIG. 16B, a step pattern 203 is formed under the remaining pattern 201. For example, the height of the step pattern 203 is set to be 50-100 nm. The remaining pattern 201 is located higher than the remaining pattern 202 by the height of the step pattern 203. The step pattern 203 is formed in a process immediately before the process of forming the processed film 204, and the material used for the step pattern 203 is changed according to the structure of the assessed device or processes to be used. For example, if the processed film 204 is a metal wiring film, the step pattern 203 is formed by a silicon dioxide film that is an interlayer insulating film in a lower layer of a device. Also, the remaining patterns 201 and 202 are both resist patterns, and they are simultaneously formed on the surface of the processed film 204 with photolithography after the processed film 204 is formed.

As described below, the lengths of the line patterns 201a and 201b, and the lengths of the line patterns 202a and 202b are measured in the second embodiment of the present invention. The length of a line pattern is more sensitive to dimension variation than the width of a line pattern. Therefore, when the length of a line pattern is measured, a device such as an optical dimension measuring device can be used other than a scanning electron microscope (SEM) dimension measuring device that is used for a normal size measurement. The optical dimension measuring device is inferior to the SEM dimension measuring device in resolution. However, the optical dimension measuring device is inexpensive, and it has a short measurement time, and it can perform a full-automatic dimension measurement. Therefore, the great advantage of simplification of a dimension measurement can be provided by using an optical dimension measuring device. Also, dimension measurements in the x direction can be conducted with the line pattern 201b of the remaining pattern 201 and the line pattern 202b of the remaining pattern 202, and dimension measurements in the y direction can be conducted with the line pattern 201a in the remaining pattern 201 and the line pattern 202a in the remaining pattern 202. Therefore, an assessment of the exposure conditions in the x direction and the y direction can be separately conducted. Also, the lengths of the line patterns 201a and 201b, and the lengths of the line patterns 202a and 202b, are set to be 2.00 μm in the second embodiment of the present invention, but these lengths can be changed properly according to the accuracy of the measurement of the dimension measuring device to be used.

Explanation of the acquisition of baseline data is herein provided. As described below, baseline data is basically acquired from each of the photolithography processes. However, if the same structure of a foundation is used and a pattern is formed under the same layout rule, common baseline data can be used in some photolithography processes. Also, baseline data that has already been acquired can be used for the same product wafer, that is, a wafer with the same device structure.

Figure 17:
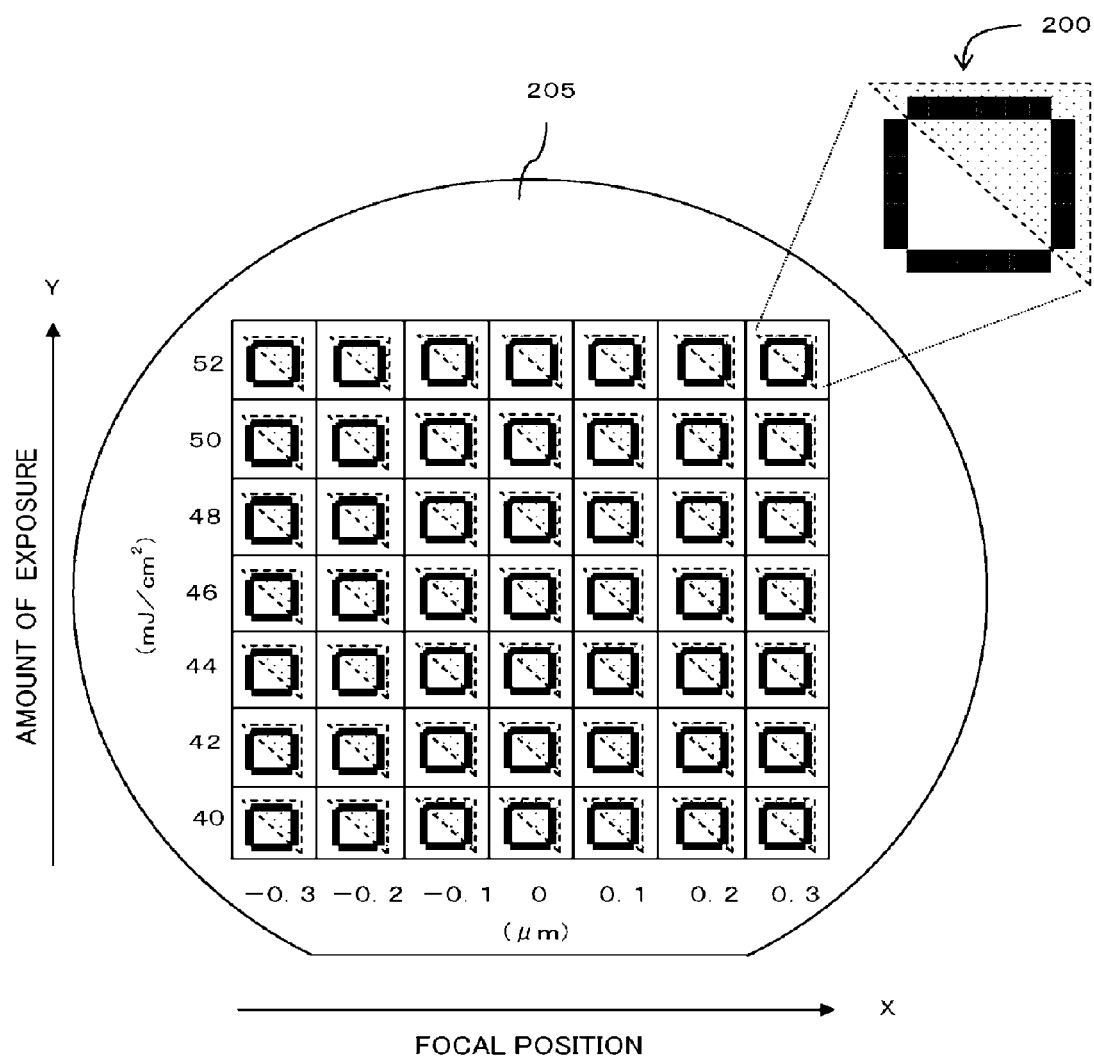
FIG. 17 shows a diagram of a shot layout of a semiconductor wafer including the exposure conditions assessment pattern used in a manufacturing method of a semiconductor device in accordance with the second embodiment of the present invention.

FIG. 17 is a diagram showing a layout of shots of an exposure on a semiconductor wafer 205 forming a semiconductor device. For example, the semiconductor wafer 205 has a 7×7 shot-layout of an exposure on its primary surface. An integrated circuit comprised of elements such as a transistor is formed on every shot, in other words, on every chip of a semiconductor wafer 205. Also, the exposure conditions assessment pattern 200 shown in FIGS. 16A and 16B, other than a circuit pattern that is a main portion of an integrated circuit, is formed on a predetermined position, such as an area in which a test element group (TEG) pattern for other process assessment is formed. Also, the exposure conditions assessment pattern 200 is drawn in a large size in the center of every shot in FIG. 17. However, it does not reflect the actual layout dimensions. Also, a shot-layout of an exposure on the semiconductor wafer 205 is not limited to the 7×7 shot-layout.

First, one or more semiconductor wafer(s) 205 is/are taken from the product lot as an assessment wafer in order to obtain baseline data to calculate amount of an exposure and a focal position in manufacturing product wafers. Then, resist patterns, that is, a circuit pattern that is a main portion of an integrated circuit and the exposure conditions assessment pattern 200, are simultaneously formed with different exposure conditions on every shot on a semiconductor wafer 205. At this time, the exposure conditions are set as follows. For example, as shown in FIG. 17, a different focal position which is expressed by the unit μm, is allocated to every shot on a semiconductor wafer 205 along the "x" direction of a shot-layout on a semiconductor wafer 205. Also, different amounts of exposure, which is expressed by unit mj/cm$^2$, are allocated to every shot on a semiconductor wafer 205 along the "y" direction on a shot-layout of a semiconductor wafer 205. For example, seven levels (scales) of focal position are allocated along the x direction as −0.3, −0.2, −0.1, 0, 0.1, 0.2, and 0.3 μm in a left-to-right fashion as shown in FIG. 17. Also, seven levels (scales) of the amount of exposure are allocated in the y direction as 40, 42, 44, 46, 48, 50, and 52 mJ/cm$^2$ from bottom up as shown in FIG. 17. The focal position and the amount of exposure hereinafter mean a predetermined value expressed by the unit μm and a predetermined value expressed by the unit mJ/cm$^2$, respectively.

Next, the dimensions of the exposure conditions assessment pattern 200 formed on every shot with different exposure conditions, that is, the lengths of line patterns 201a and 201b in the remaining patterns 201 and the lengths of line patterns 202a and 202b in the remaining pattern 202, respectively, are measured. Here, the dimension measurements in the x direction can be conducted with the line pattern 201b in the remaining pattern 201 and the line pattern 202b in the remaining pattern 202. Also, the dimension measurements in the y direction can be conducted with the line pattern 201a in the remaining pattern 201 and the line pattern 202a in the remaining pattern 202. As described below, an explanation of the dimension measurements is provided with an example of dimension measurements in the x direction.

However, the dimension measurements in the y direction also can be conducted in the same way.

Figure 18:
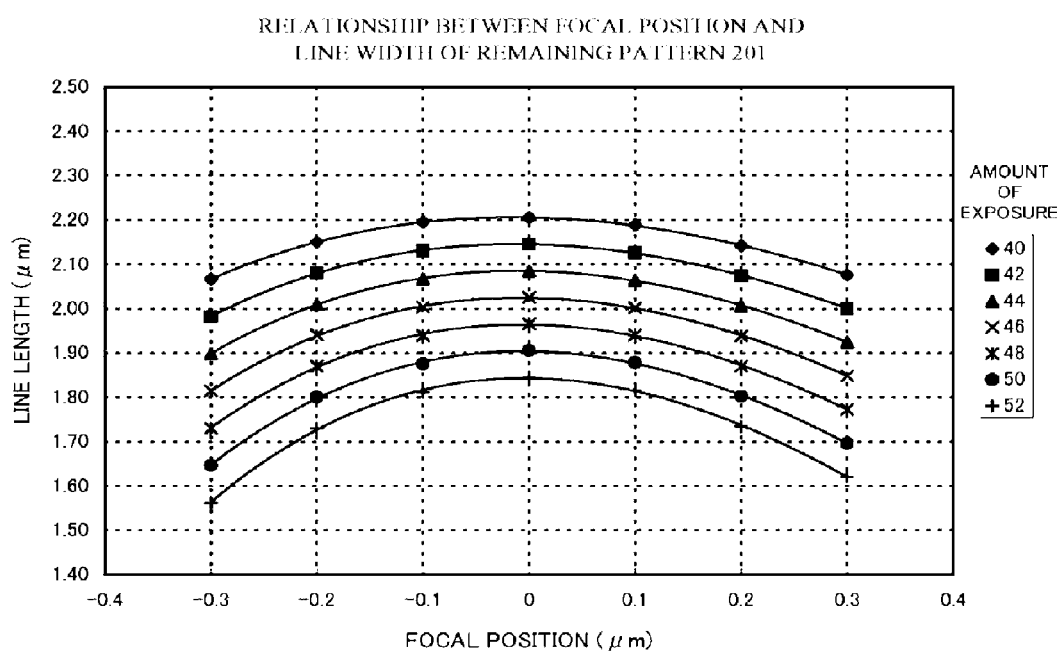
FIG. 18 shows a diagram of the relationship between focal position and line width of a remaining pattern in a manufacturing method of a semiconductor device in accordance with the second embodiment of the present invention.
Figure 19:
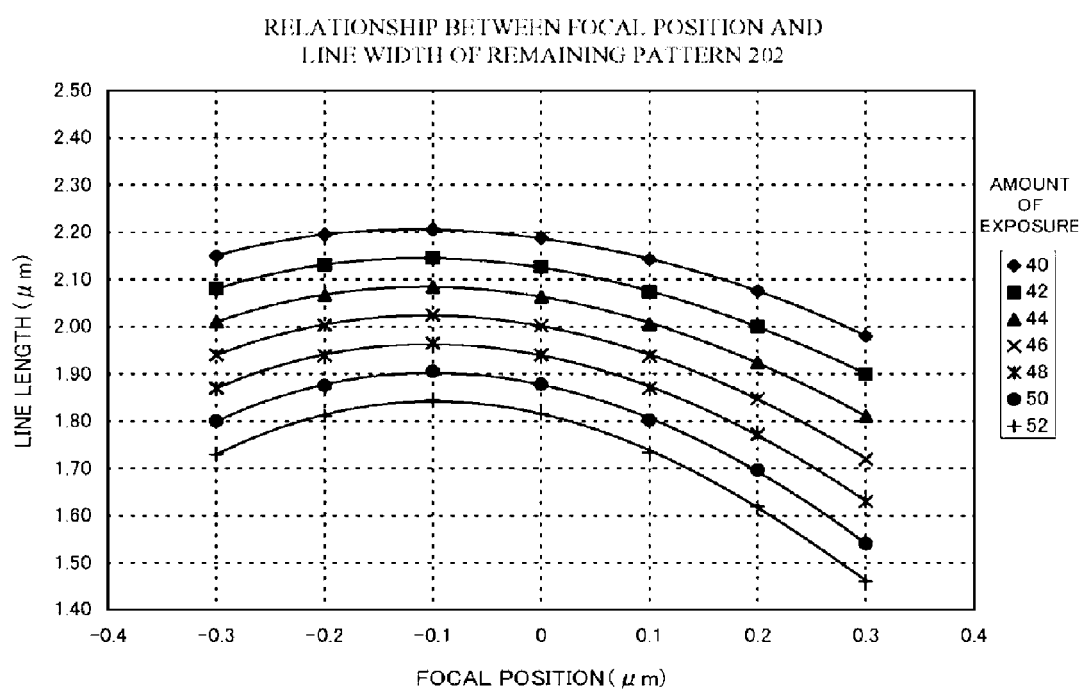
FIG. 19 shows a diagram of the relationship between focal position and line width of a remaining pattern in a manufacturing method of a semiconductor device in accordance with the second embodiment of the present invention.

FIG. 18 shows the relationship between the focal position and the line length of the remaining pattern 201 (i.e., line length of a line pattern 201a) with respect to each amount of exposure. As shown in FIG. 18, it can be seen that the relationship between the focal position and the line length of the remaining pattern 201 is represented by a substantially quadratic curve with an extremum at a focal position 0 μm. FIG. 19 shows the relationship between the focal position and line length of the remaining pattern 202 (i.e., the line length of the line pattern 202b) with respect to each amount of exposure. As shown in FIG. 19, it can be seen that the relationship between the focal position and line length of the remaining pattern 202 is represented by a substantially quadratic curve with an extremum that is apart from a focal position 0 μm in the negative direction. The difference between the extremums of the focal position is originated from the difference between the height of the remaining patterns 201 and 202.

Figure 20:
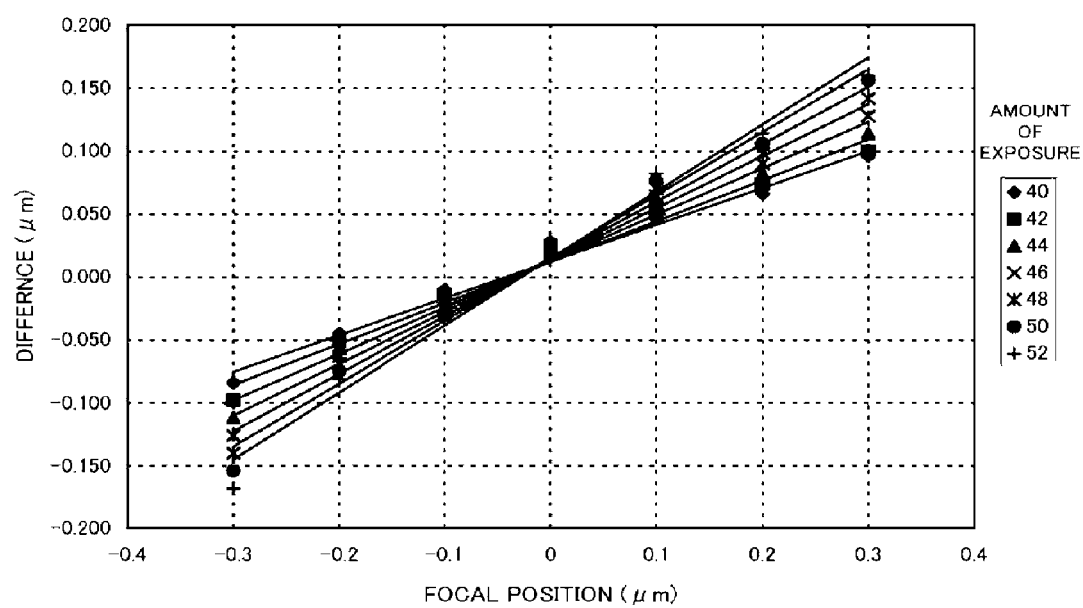
FIG. 20 shows a diagram of the relationship between focal position and the difference between pattern dimensions in a manufacturing method of a semiconductor device in accordance with the second embodiment of the present invention.

Next, the difference between the line length of the remaining pattern 201 shown in FIG. 18 and that of the remaining pattern 202 shown in FIG. 19 is calculated with respect to the same amount of exposure and focal position. In other words, the difference between the line lengths is calculated by the following formula: difference between lengths=(line length of the remaining pattern 201)−(line length of the remaining pattern 202). FIG. 20 shows the relationship between the focal position and the difference between the line lengths with respect to each amount of exposure with an example of the exposure conditions shown in FIG. 17.

Next, primary approximation is conducted with respect to the results shown in FIG. 20, and a primary approximation formula (11) is derived for each amount of exposure. Also, the difference between line lengths and focal position are expressed by variable y and variable x, respectively.

$$y(\text{difference of line lengths})=a21*x(\text{focal position})+b21$$

FIG. 21 shows the approximation formula (11) which is derived for each amount of exposure and its coefficients a21 and b21 with an example of the exposure conditions shown in FIG. 17.

Figure 22:
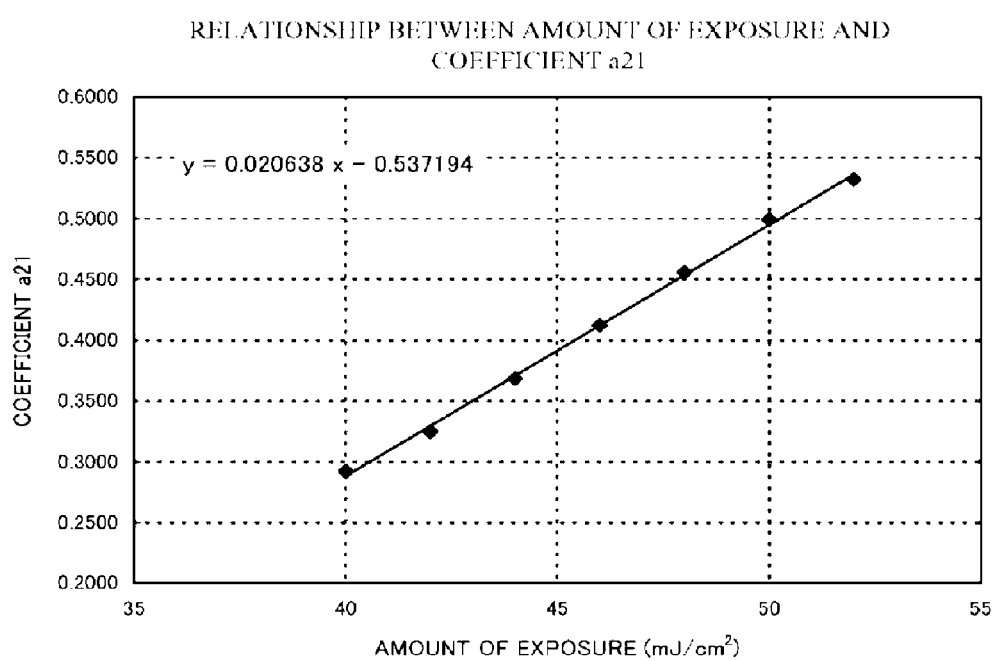
FIG. 22 shows a diagram of the relationship between the amount of exposure and the coefficient a21 in a manufacturing method of a semiconductor device in accordance with the second embodiment of the present invention.
Figure 23:
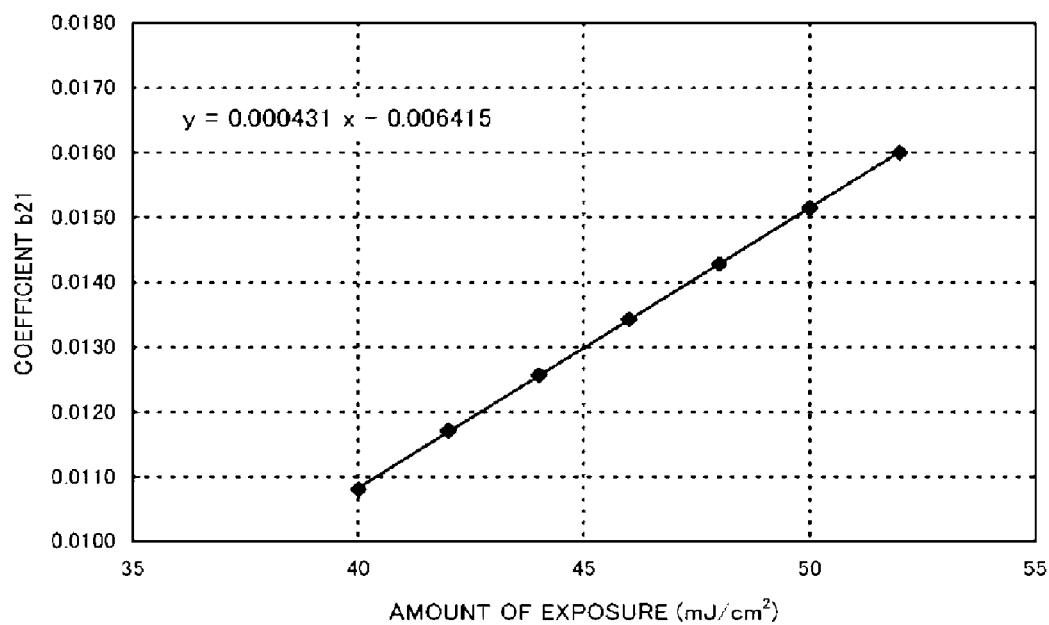
FIG. 23 shows a diagram of the relationship between the amount of exposure and the coefficient a21 in a manufacturing method of a semiconductor device in accordance with the second embodiment of the present invention.

Next, the relationship between the amount of exposure and coefficient a21, and the relationship between the amount of exposure and coefficient b21 are derived from the result shown in FIG. 21. FIG. 22 shows the relationship between the amount of exposure and coefficient a21 with an example of the exposure conditions shown in FIG. 17. Also, FIG. 23 shows the relationship between amount of exposure and coefficient b21 with an example of the exposure conditions shown in FIG. 17.

Next, primary approximation is conducted for the results shown in FIG. 22, and an approximation formula (12) for coefficient a21 is derived. Also, primary approximation is conducted for the results shown in FIG. 23, and an approximation formula (13) for coefficient b21 is derived. Also, coefficient a21 is expressed by variable y and the amount of exposure is expressed by variable x in the approximation formula (12). Also, coefficient b21 is expressed by variable y and the amount of exposure is expressed by variable x in the approximation formula (13).

$$y(a21)=a22*x(\text{amount of exposure})+b22 \quad \text{Approximation formula (12)}$$

$$y(b21)=a23*x(\text{amount of exposure})+b23 \quad \text{Approximation formula (13)}$$

Figure 24:
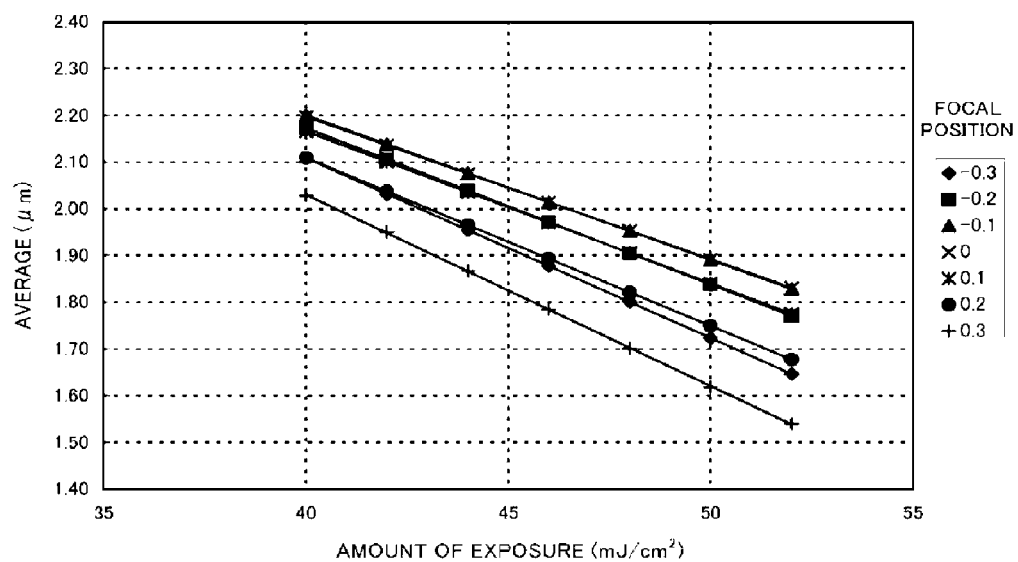
FIG. 24 shows a diagram of the relationship between the amount of exposure and the average value of a pattern in a manufacturing method of a semiconductor device in accordance with the second embodiment of the present invention.

Next, the average line length of the remaining pattern 201 shown in FIG. 18 and the average line length of the remaining pattern 202 shown in FIG. 19 is calculated with respect to the same amount of exposure and focal position. In other words, the average is calculated by the following formula: average= [(line length of the remaining pattern 201)+(line length of the remaining pattern 202)]/2. FIG. 24 shows the relationship between the amount of exposure and the average line length with respect to each focal position with an example of the exposure conditions shown in FIG. 17.

Next, primary approximation is conducted for the result shown in FIG. 24, and an approximation formula (14) is derived with respect to each focal position. Also, the average line length is expressed by variable y and the amount of exposure is expressed by variable x in the approximation formula (14).

$$y(\text{average})=a24*x(\text{amount of exposure})+b24 \quad \text{Approximation formula (14)}$$

FIG. 25 shows the approximation formula (14) which is derived with respect to each focal position and its coefficients a24 and b24 with an example of the exposure conditions shown in FIG. 17.

Figure 26:
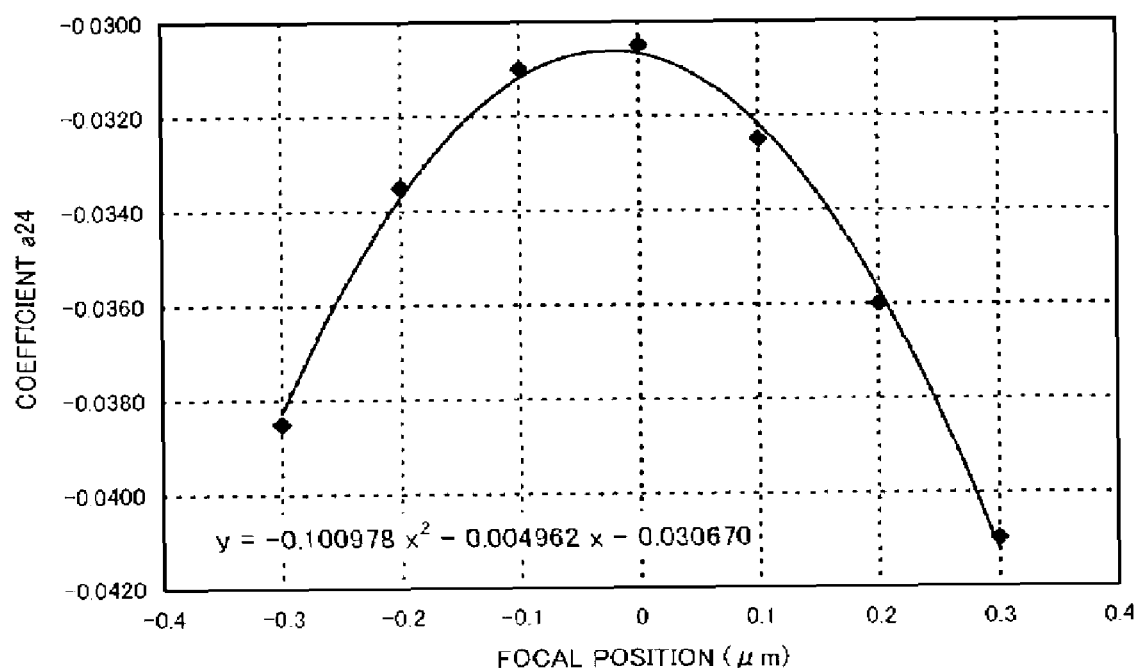
FIG. 26 shows a diagram of the relationship between focal position and the coefficient a24 in a manufacturing method of a semiconductor device in accordance with the second embodiment of the present invention.
Figure 27:
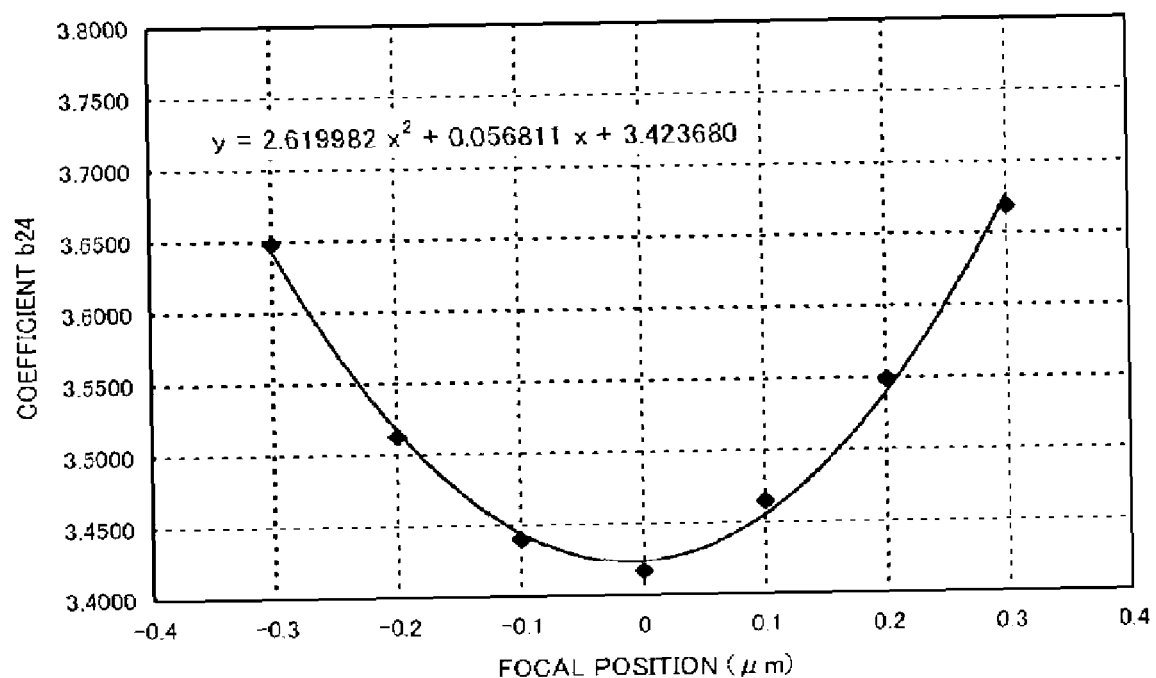
FIG. 27 shows a diagram of the relationship between focal position and the coefficient b24 in a manufacturing method of a semiconductor device in accordance with the second embodiment of the present invention.

Next, the relationship between the focal position and coefficient a24 and the relationship between the focal position and coefficient b24 are derived from the result shown in FIG. 25. FIG. 26 shows the relationship between a focal position and coefficient a24 with an example of the exposure conditions shown in FIG. 17. Also, FIG. 27 shows the relationship between the focal position and coefficient b24 with an example of the exposure conditions shown in FIG. 17.

Next, secondary approximation is conducted for the result shown in FIG. 26, and an approximation formula (15) for coefficient a24 is derived. Also, secondary approximation is conducted for the result shown in FIG. 27 and an approximation formula (16) for coefficient b24 is derived. Also, coefficient a24 is expressed by variable y and the focal position is expressed by variable x in the approximation formula (15). Also, coefficient b24 is expressed by variable y and the focal position is expressed by variable x in the approximation formula (16).

$$y(a24)=a25*x(\text{focal position})^2+b25*x(\text{focal position})+c25 \quad \text{Approximation formula (15)}$$

$$y(b14)=a26*x(\text{focal position})^2+b26*x(\text{focal position})+c26 \quad \text{Approximation formula (16)}$$

The amount of exposure and the focal position at the start of manufacturing products are calculated and assessed based on baseline data comprised of approximation formulas (12), (13), (15), and (16).

An explanation of the calculation of the exposure conditions is hereinafter provided. At the start of manufacturing product wafers, an exposure treatment is normally conducted with the exposure conditions that are thought to be optimal and are set in advance based on an examination of various exposure conditions, so that the desired objective dimensions can be obtained. However, the finished dimensions of a pattern are influenced by variations in a device or variations in the environment when conducting an exposure treatment, such as the instability of the device itself and the temperature or humidity surrounding a device. Therefore, all patterns cannot be necessarily formed in the desired objective dimensions, even if the exposure conditions that are thought to be optimal are used. Because of this, at the start of manufacturing actual product wafers, the exposure conditions may be checked by processing one or more wafer(s) in advance (hereinafter called the pre-processing exposure conditions) before all the wafers of the product lot are processed. In this case, the exposure conditions are assessed based on the calculation of variations in the exposure conditions with the baseline data comprised of approximation formulas (12), (13), (15), and (16).

First, the amount of exposure that was used in the pre-processing, that is, the amount of exposure that is thought to be optimal at the time, is substituted for x (amount of exposure) in approximation formulas (12) and (13) as the provisional amount of exposure. As a result of this, coefficients y(a21) and y(b21) can be obtained. The coefficients y(a21) and y(b21) are used as coefficients a21 and b21 in the approximation formula (11), respectively. Because of this, the approximation formula (11) can be transformed to a formula (17).

$$y(\text{difference between line lengths}) = y(a21) * x(\text{focal position}) + y(b21) \quad \text{Formula (17)}$$

Furthermore, the formula (17) can be transformed to a formula (18).

$$x(\text{focal position}) = [y(\text{difference between length}) - y(b21)] / y(a21) \quad \text{Formula (18)}$$

In the formula (18), the difference between line lengths is expressed by variable y, and the focal position is expressed by variable x. Therefore, an actual focal position can be calculated by substituting the difference between the lengths that is obtained by measurement of lengths in a wafer in which pre-processing is actually conducted, that is, the difference between the line lengths that are obtained by measurement of the line lengths of line pattern 201b in the remaining pattern 201 and that of line pattern 202b in the remaining pattern 202, for variable y (difference between lengths) in the formula (18).

Next, the focal position obtained in the formula (18) is substituted for variable x (focal position) in approximation formulas (15) and (16). As a result, coefficients y(a24) and y(b24) can be obtained. The coefficients y(a24) and y(b24) are used as coefficients a24 and b24 in the approximation formula (14), respectively. Because of this, the approximation formula (14) can be transformed to an approximation formula (19).

$$y(\text{average}) = y(a24) * x(\text{amount of exposure}) + y(b24) \quad \text{Formula (19)}$$

Furthermore, the formula (19) can be transformed to a formula (20).

$$x(\text{amount of exposure}) = [y(\text{average}) - y(b24)] / y(a24) \quad \text{Formula (20)}$$

In the formula (20), the average is expressed by variable y, and the amount of exposure is expressed by variable x. Therefore, the actual amount of an exposure can be calculated by substituting the average obtained by measurement of the line lengths in a wafer that is actually processed in advance, that is, the average obtained by measurement of the line lengths of line pattern 201b in the remaining pattern 201 and that of the line pattern 202b in the remaining pattern 202, for variable y (average) in the formula (20).

Following is an actual example of the calculation and assessment of the exposure conditions in the second embodiment of the present invention.

Explanation of the acquisition of baseline data is hereinafter provided. First, one or more semiconductor wafer(s) 205 was/were taken from the product lot as an assessment wafer(s) in order to obtain baseline data to calculate the amount of exposure and the focal position at the start of manufacturing the product wafers. Then, a resist pattern, that is, the exposure conditions assessment pattern 200 was formed in the exposure conditions shown in FIG. 17.

Next, the dimensions of the exposure condition assessment pattern 200 that was formed in every shot with different exposure conditions were measured. Here, the dimension measurement is conducted with the dimension measurement in the x direction, that is, with the line patterns 201b and 202b in the remaining patterns 201 and 202. FIG. 18 shows the relationship between the focal position and line length of the remaining pattern 201 with respect to each amount of exposure. Also, FIG. 19 shows the relationship between the focal position and line width of the remaining pattern 202 with respect to each amount of exposure.

Next, the difference between the line lengths of the remaining pattern 201 shown in FIG. 18 and the remaining pattern 202 shown in FIG. 19 is calculated with respect to the same amount of exposure and that of the focal position. FIG. 20 shows the relationship between the focal position and the difference between line lengths with respect to each amount of exposure.

Next, primary approximation is conducted for the result shown in FIG. 20. Then, an approximation formula (11) and its coefficients a21 and b21 are derived for each amount of exposure. FIG. 21 shows the approximation formula (11) and its coefficients a21 and b21 derived for each amount of exposure.

Next, the relationship between the amount of exposure and coefficient a21, and the relationship between the amount of exposure and coefficient b21 are derived from the results shown in FIG. 21. FIG. 22 shows the relationship between the amount of exposure and coefficient a21. Also, FIG. 23 shows the relationship between the amount of exposure and coefficient b21.

Next, primary approximation is conducted for the results shown in FIG. 22, and an approximation formula (12)' for coefficient a21 is derived. Also, primary approximation is conducted for the results shown in FIG. 23, and an approximation formula (13)' for coefficient b21 is derived.

$$y(a21) = 0.020638 * x(\text{amount of exposure}) \quad \text{Approximation formula (12)'}$$

$$y(b21) = 0.000431 * x(\text{amount of exposure}) \quad \text{Approximation formula (13)'}$$

Next, the average line length of the remaining pattern 201 shown in FIG. 18 and the line length of the remaining pattern 202 shown in FIG. 19 is calculated with respect to the same amount of exposure and focal position. FIG. 24 shows the relationship between the amount of exposure and the average line lengths with respect to each focal position.

Next, primary approximation is conducted for the results shown in FIG. 24, and an approximation formula (14) is derived with respect to each focal point and coefficients a24 and b24 are derived. FIG. 25 shows the approximation formula (14) derived with respect to each focal point and its coefficients a24 and b24.

Next, the relationship between focal position and coefficient a24, and the relationship between focal position and coefficient b24 are derived from the results shown in FIG. 25, respectively. FIG. 26 shows the relationship between focal position and coefficient a24. Also, FIG. 27 shows the relationship between focal position and coefficient b24.

Next, secondary approximation is conducted for the results shown in FIG. 26, and an approximation formula (15)' for coefficient a24 is derived. Also, secondary approximation is conducted for the results shown in FIG. 27, and an approximation formula (16)' for coefficient b24 is derived.

$$y(a24)=-0.100978*x(\text{focal position})^2-0.004962*x(\text{focal position})-0.030670 \quad \text{Approximation formula (15)'}$$

$$y(b24)=2.619982*x(\text{focal position})^2+0.056811*x(\text{focal position})+3.423680 \quad \text{Approximation formula (16)'}$$

The exposure conditions are assessed based on the calculation of the amount of exposure and focal position at the start of manufacturing products with baseline data comprised of the above described approximation formulas (12)', (13)', (15) ', and (16)'.

Figure 28:
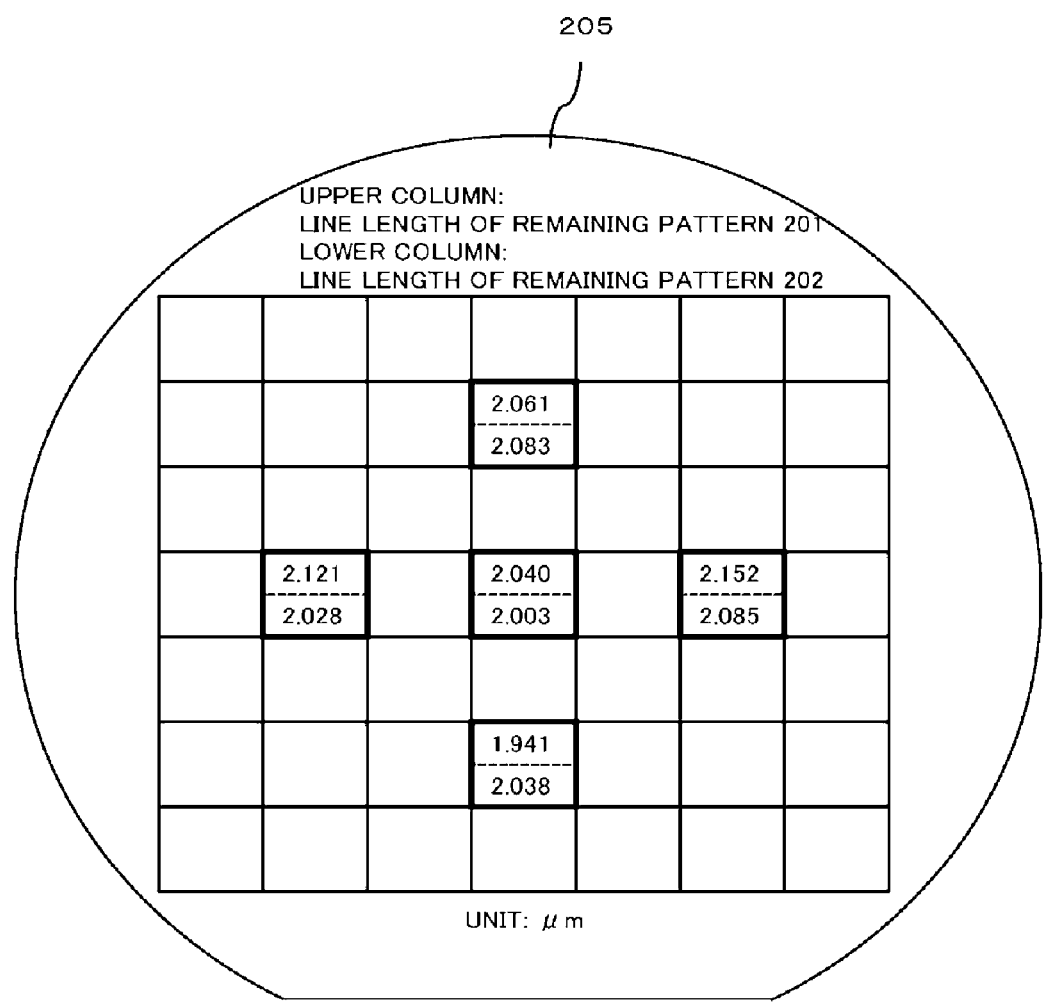
FIG. 28 shows the results of measuring the dimensions of the exposure conditions assessment pattern used in a manufacturing method of a semiconductor device in accordance with the second embodiment of the present invention.
Figure 29:
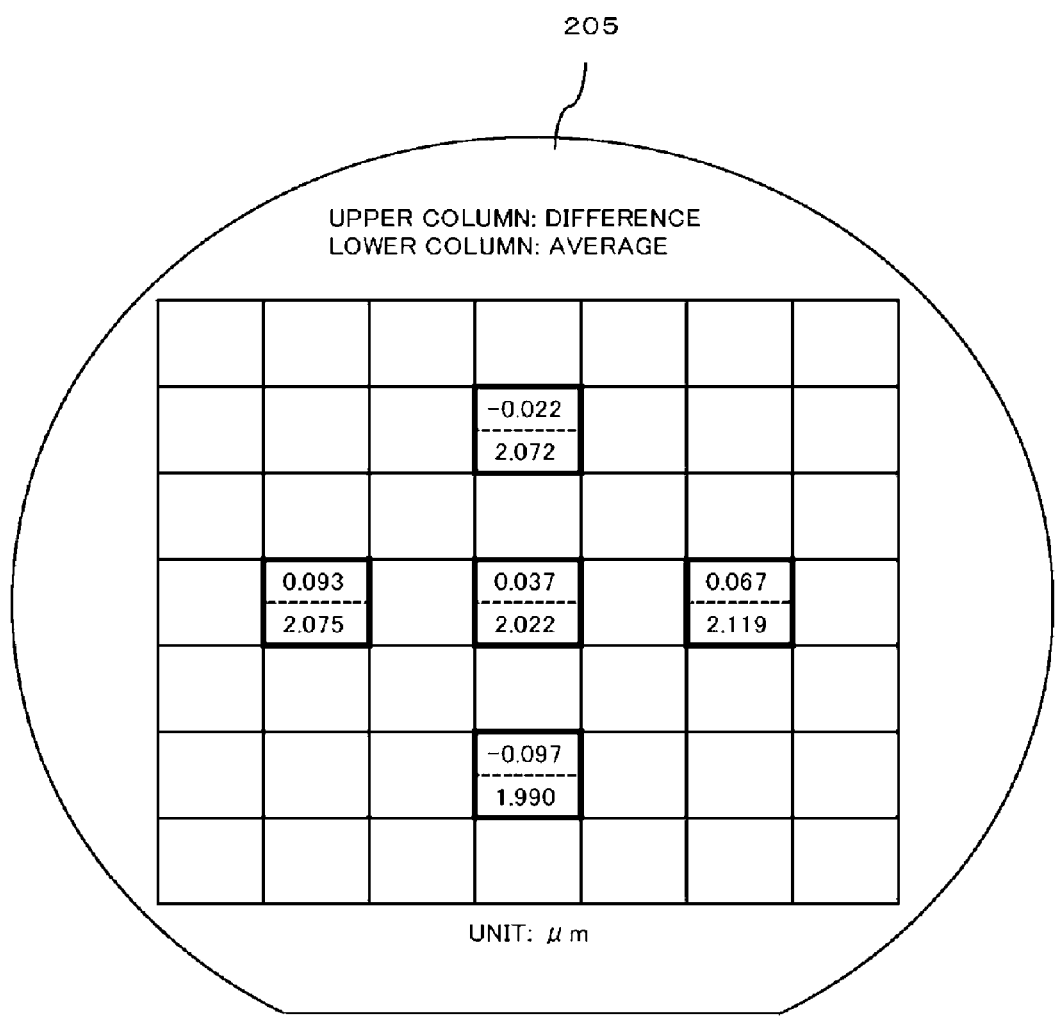
FIG. 29 shows the results of measuring the difference in the dimensions and average of the exposure conditions assessment pattern used in a manufacturing method of a semiconductor device in accordance with the second embodiment of the present invention.

An example of the calculation of the exposure conditions is hereinafter provided. FIG. 28 shows the results of the measurement of line length in the semiconductor wafer 205 that is processed in advance in the exposure conditions that are thought to be optimal. More specifically, the figure shows the results of the measurement of the line length of the line pattern 201b in the remaining pattern 201 in an upper column of each shot, and it also shows the results of the measurement of the line length of the line pattern 202b in the remaining pattern 202 in a lower column of each shot. Also, the measurement of line length is conducted for 5 shots shown in FIG. 28 in the semiconductor wafer 205 with a 7×7 shot-layout. Also, FIG. 29 shows the difference and average that were calculated between the line length of the remaining pattern 101 and that of the remaining pattern 102 in an upper column and a lower column of a shot, respectively, based on the results of the measurement shown in FIG. 28.

Here, the exposure conditions are calculated for a shot located in the center of the five shots (hereinafter called a center shot) on the semiconductor wafer 205. As shown in FIG. 28, the line length of the remaining pattern 201 in the center shot on the semiconductor wafer 205 and the remaining pattern 202 are 2.040 and 2.003 µm, respectively. Also, as shown in FIG. 29, the difference between line length of the remaining pattern 201 and the remaining pattern 202 is 0.037 µm, and the average of the line lengths of the remaining pattern 201 and the remaining pattern 202 is 2.022 µm. Also, the exposure conditions of this pre-processing are set as follows. That is, the amount of exposure is set to be 44.0 mJ/cm², and the focal position is set to be +0.05 µm.

First, the amount of exposure 44.0 mJ/cm² that is used in the pre-processing is substituted variable x (amount of exposure) in both the approximation formulas (12)' and (13)' as a provisional amount of exposure. As a result, coefficients a21 and b21 are derived as follows.

Coefficient $a21=0.020638*44.0-0.537194=0.370878$

Coefficient $b21=0.000431*44.0-0.006415=0.012549$

Next, the coefficients a21 and b21 are substituted for variables y(a21) and y(b21) in the approximation formula (18) that is used to derive the focal position, respectively. Also, 0.037 µm is substituted for variable y (difference of length) in the approximation formula (18). As a result, a provisional focal position is derived as follows.

Provisional focal position=$(0.037-0.012549)/0.370878=+0.066$ µm

Next, this provisional focal position is substituted for variable x (focal position) in the approximation formulas (15)' and (16)'. As a result, coefficients a24 and b24 are derived as follows.

Coefficient $a24=-0.100978*0.066^2-0.004962*0.066-0.030670=-0.031437$

Coefficient $b24=2.619982*0.066^2+0.056811*0.066+3.423680=3.438842$

Next, the coefficients a24 and b24 are substituted for variables y(a24) and y(b24) in the approximation formula (20) that is used to derive the amount of exposure. Also, 2.022 µm is substituted for variable y (average) in the approximation formula (20). As a result, the actual amount of exposure whose conditions are varied because of various variation factors such as device variation and environmental variation is derived as follows.

Actual amount of exposure=$(2.022-3.438842)/(-0.031437)=45.1$ mJ/cm²

The provisional focal position is calculated with a provisional amount of exposure. Therefore, the actual focal position whose condition is varied is calculated with the actual amount of exposure once again. Coefficients a21 and b21 are calculated as follows by substituting the newly calculated amount of exposure 45.1 mJ/cm² for variable x (amount of exposure) in the approximation formulas (12)' and (13)'.

Coefficient $a21=0.020638*45.1-0.537194=0.393580$

Coefficient $b21=0.000431*45.1-0.006415=0.013023$

The coefficients a21 and b21 are substituted for variables y(a21) and y(b21) in the approximation formula (18) that is used to derive focal position. Also, 0.037 µm is substituted for variable y (difference of line lengths) in the approximation formula (18). As a result, the actual focal position is derived as follows.

Actual focal position=$(0.037-0.013023)/0.393580=+0.061$ µm

Thus, the actual exposure conditions that are varied because of various variation factors such as device variation and environmental variation, that is, the actual amount of exposure 45.1 mJ/cm² and the actual focal position +0.061 µm can be calculated back, by measuring the line lengths of the remaining patterns 201 and 202 formed with the amount of exposure 44.0 mJ/cm² and the focal position +0.05 µm, calculating the difference and average of the line lengths of the remaining patterns 201 and 202, and then substituting the difference and the average for variables in the approximation formulas of baseline data (12)', (13)', (15)' and (16)'. In other words, the actual exposure conditions can be calculated from the difference in the line lengths of the remaining patterns 201 and 202.

Figure 30:
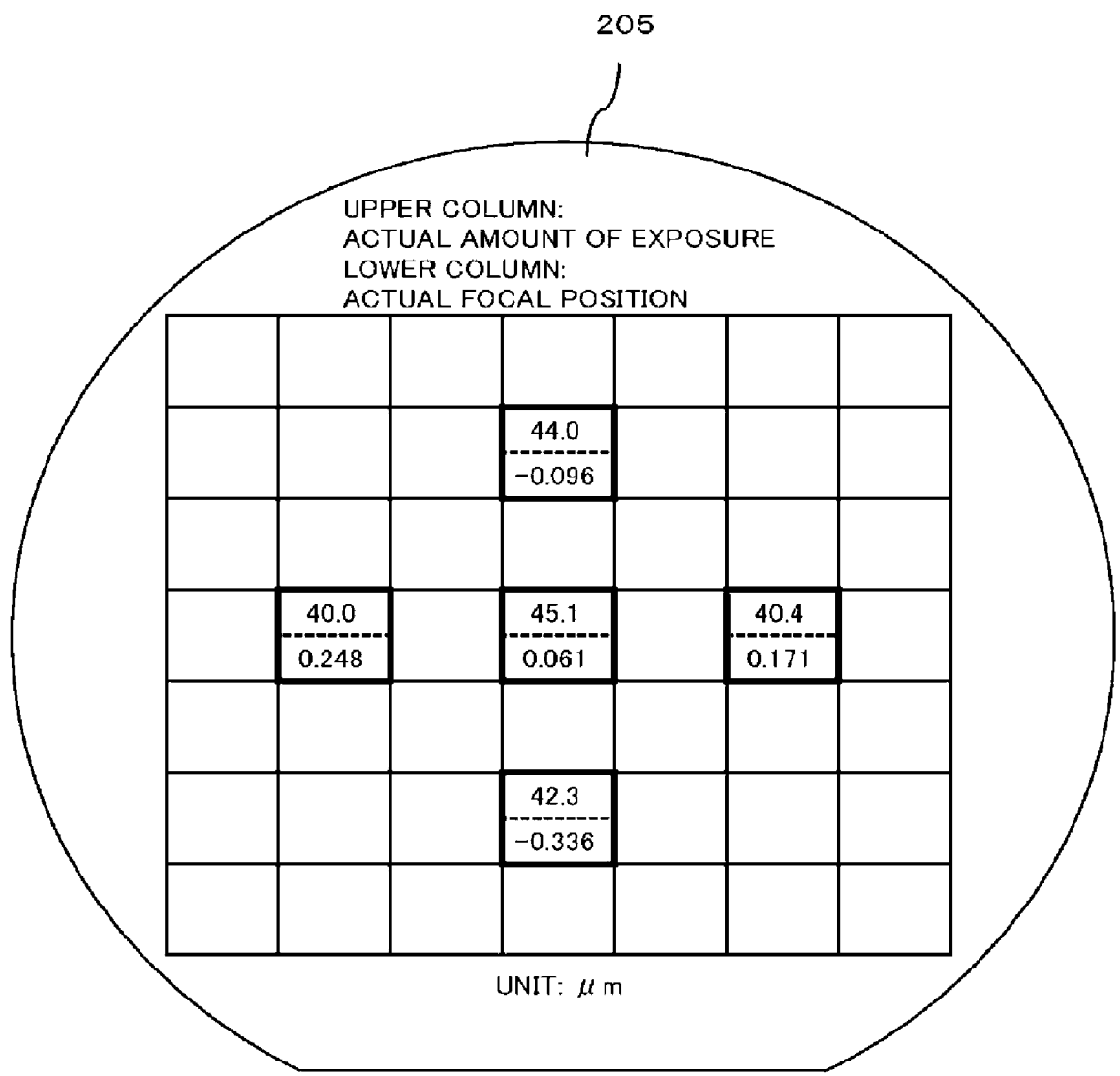
FIG. 30 show a diagram of actual exposure conditions calculated in a manufacturing method of a semiconductor device in accordance with the second embodiment of the present invention.

As described above, the actual exposure conditions, which are varied because of various variation factors, is calculated with respect to the center shot on the semiconductor wafer 205. FIG. 30 shows the results of the calculation of the actual exposure conditions with respect to five shots shown in FIG. 28 with the above described method. FIG. 30 shows the actual amount of exposure of each of five shots in an upper column of the shot, and it also shows the actual focal position of each of five shots in a lower column of the shot. Form the results shown in FIG. 30, the average of the actual amount of exposure of 5 shots is calculated to be 42.4 mJ/cm² and the average of the actual focal positions of 5 shots is calculated to be +0.010 µm. For example, the results of these calculations can be used as follows. First, a pattern can be formed with dimensions closer to the objective dimensions at the start of manufacturing the product wafers by fine-adjusting the exposure conditions with the actual amount of exposure and the actual focal position that are calculated as average on a surface of the semiconductor wafer 205. Second, the stability of an exposure device can be assessed, and adjustment and correction of an exposure device itself can be conducted by assessing the trend of variation in the exposure conditions on a surface of a wafer with the actual amount of exposure and the actual focal position that are calculated for each of the shots of the semiconductor wafer 205, such as 5 shots shown in FIG. 28.

According to the second embodiment of the present invention, two types of a resist pattern located at different level of height are used, and they are formed by changing the amount of exposure and the focal position for each of the shots of the semiconductor wafer 205. The two types of resist pattern are the remaining pattern 201 that is formed on the step pattern 203 and the remaining pattern 202 that is formed lower than the remaining pattern 201 by the step pattern 203. Also, the difference and average of the line lengths of the line patterns 201a and 202a in the remaining patterns 201 and 202, or difference and average of the line lengths of the line patterns 201b and 202b in the remaining patterns 201 and 202, respectively, are measured, and baseline data is obtained based on these measured results. Also, before all the wafers of the product lot are processed, actual exposure conditions that are varied because of various variation factors such as device variation and environmental variation can be calculated back by substituting the results of the measurement of the dimensions of the semiconductor device 205 that is processed in advance with the exposure conditions that are thought to be optimal, that is, by substituting the results of the difference and the average of line lengths of line patterns 201a and 202a in the remaining patterns 201 and 202, respectively, or by substituting the results of the difference and the average of the line lengths of line patterns 201b and 202b in the remaining patterns 201 and 202, respectively, for variables in an approximation formula of baseline data. In other words, it is possible to calculate and assess the actual exposure conditions based on the difference in the line lengths of the remaining patterns 201 and 202. Also, the line patterns 201a and 201b in the remaining pattern 201 are located at right angles to each other, and the line patterns 202a and 202b in the remaining pattern 202 are also located at right angles to each other. Therefore, the dimension measurements in the y direction can be conducted with the line patterns 201a and 202a, for instance. Also, the dimension measurements in the x direction can be conducted with the line patterns 201b and 202b, for instance. Because of this, the assessment of the exposure conditions can be conducted in two directions (i.e., the x direction and the y direction), and the assessment of the exposure conditions can be conducted in greater detail.

This application claims priority to Japanese Patent Application No. 2004-379544. The entire disclosure of Japanese Patent Application No. 2004-379544 is hereby incorporated herein by reference.

The terms of degree, such as "nearly", used herein mean a reasonable amount of deviation of the modified term such that the end result is not significantly changed. For example, the terms can be construed as including a deviation of at least +5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing semiconductor devices, comprising the steps of:
   accessing a plurality of exposure conditions of an exposure device having an optical axis;
   adjusting the exposure device in view of the assessed exposure conditions; and
   using the adjusted exposure device during processing of a semiconductor wafer to fabricate the semiconductor devices,
   wherein the step of adjusting the exposure device comprises a preliminary step (a) and a preliminary step (b),
   wherein said preliminary step (a) comprises the steps of:
      (i) forming a plurality of first assessment patterns and second assessment patterns on a principal surface of a first wafer-shaped workpiece with a plurality of exposure conditions in which the amount of exposure and the focal position are varied, said second assessment patterns being disposed lower than said first assessment patterns in the direction of the optical axis of said exposure device;
      (ii) measuring the dimensions of said first assessment patterns and said second assessment patterns;
      (iii) calculating a first difference and a first average between the measured dimensions of said first assessment patterns and the measured dimensions of said second assessment patterns that are formed with the same amount of exposure and the same focal position; and
      (iv) creating baseline data with respect to the exposure conditions based on said first difference and said first average; and
   wherein said preliminary step (b) comprises the steps of:
      (i) forming further first assessment patterns and further second assessment patterns on a principal surface of a second wafer-shaped workpiece with a predetermined amount of exposure and focal position;
      (ii) measuring the dimensions of said further first assessment patterns and the dimensions of said further second assessment patterns;
      (iii) calculating a second difference and a second average between the measured dimensions of said further first assessment patterns and the measured dimensions of said further second assessment patterns; and
      (iv) assessing said exposure conditions by substituting said second difference and said second average for said baseline data and then calculating the actual amount of exposure and the actual focal position that are to be set in the adjusting step.

2. The method for manufacturing semiconductor devices according to claim 1, wherein said first and second assessment patterns and said first and second further assessment patterns each include a plurality of substantially rectangular line patterns, and are formed in the same shape.

3. The method for manufacturing semiconductor devices according to claim 2, wherein the measurement of the dimensions of said first and second assessment patterns and said first and second further assessment patterns is conducted for the line width in the short direction of said line patterns.

4. The method for manufacturing semiconductor devices according to claim 1, wherein:
   at least one of said first assessment patterns comprises a third assessment pattern having a plurality of substantially rectangular line patterns and a fourth assessment pattern having a plurality of substantially rectangular line patterns located at right angles to said third assessment pattern;
   at least one of said second assessment patterns comprises a fifth assessment pattern having a plurality of substantially rectangular line patterns located parallel to said third assessment pattern and a sixth assessment pattern having a plurality of substantially rectangular line patterns located parallel to said fourth assessment pattern; and said third assessment pattern and said fourth assessment pattern, and said fifth assessment pattern and said sixth assessment pattern, are formed in the same shape.

5. The method for manufacturing semiconductor devices according to claim 4, wherein the measurement of the dimensions of said first assessment patterns and said second assessment patterns is conducted with respect to a first direction with said third assessment pattern and said fifth assessment pattern, and conducted with respect to a second direction at right angles to said first direction with said fourth assessment pattern and said sixth assessment pattern.

6. The method for manufacturing semiconductor devices according to claim 5, wherein the measurement of the dimensions of said third assessment pattern, said fourth assessment pattern, said fifth assessment pattern, and said sixth assessment pattern is conducted for the line width in the long direction of said line pattern.

7. The method for manufacturing semiconductor devices according to claim 6, wherein the measurement of the dimensions of said third assessment pattern, said fourth assessment pattern, said fifth assessment pattern, and said sixth assessment pattern is conducted by an optical dimension measuring device.

8. The method for manufacturing semiconductor devices according to claim 1, wherein said step (iii) of creating baseline data comprises the steps of:

creating a first basic formula having a first coefficient and a second coefficient by numerically expressing, with a first approximation, a variation in said first difference with respect to a variation in the focal position for each amount of exposure;

creating a second basic formula by numerically expressing, with said first approximation, a variation in said first coefficient with respect to a variation in the amount of exposure;

creating a third basic formula by numerically expressing, with the first approximation, a variation in said second coefficient with respect to a variation in the amount of exposure;

creating a fourth basic formula comprising a third coefficient and a fourth coefficient by mathematically expressing, with the first approximation; a variation in said first average with respect to a variation in the amount of exposure for each focal position;

creating a fifth basic formula by mathematically expressing, with a second approximation, a variation in said third coefficient with respect to a variation in the focal position; and creating a sixth basic formula by mathematically expressing, with the second approximation, a variation in said fourth coefficient with respect to a variation in the focal position.

9. The method for manufacturing semiconductor devices according to claim 8, wherein said step (iv) of assessing said exposure conditions comprises the steps of:

deriving a first value of said first coefficient by substituting said predetermined amount of exposure for said second basic formula;

deriving a second value of said second coefficient by substituting said predetermined amount of exposure for said third basic formula;

calculating an actual focal position by substituting said second difference for said first difference of said first basic formula, substituting said first value for said first coefficient of said first basic formula, and substituting said second value for said second coefficient of said first basic formula;

deriving a third value of said third coefficient by substituting said actual focal position for said fifth basic formula;

deriving a fourth value of said fourth coefficient by substituting said actual focal position for said sixth basic formula; and calculating an actual amount of exposure by substituting said second average for said first average of said fourth basic formula, substituting said third value for said third coefficient of said fourth basic formula, and substituting said fourth value for said fourth coefficient of said fourth basic formula.

10. The method for manufacturing semiconductor devices according to claim 9, wherein said first and second assessment patterns and said first and second further assessment patterns each include a plurality of substantially rectangular line patterns, and are formed in the same shape.

11. The method for manufacturing semiconductor devices according to claim 10, wherein the measurement of the dimensions of said first assessment patterns and said second assessment patterns is conducted for the line width in the short direction of said line patterns.

12. The method for manufacturing semiconductor devices according to claim 9, wherein at least one of said first assessment patterns includes a third assessment pattern having a plurality of substantially rectangular line patterns and a fourth assessment pattern having a plurality of substantially rectangular line patterns located at right angles to said third assessment pattern;

at least one of said second assessment patterns includes a fifth assessment pattern having a plurality of substantially rectangular line patterns located parallel to said third assessment pattern and a sixth assessment pattern having a plurality of substantially rectangular line patterns located parallel to said fourth assessment pattern; and said third assessment pattern and said fourth assessment pattern, and said fifth assessment pattern and said sixth assessment patterns, are formed in the same shape.

13. The method for manufacturing semiconductor devices according to claim 12, wherein measurement of dimensions of said first assessment patterns and said second assessment patterns is conducted with respect to a first direction with said third assessment pattern and said fifth assessment pattern, and conducted with respect to a second direction at right angles to said first direction with said fourth assessment pattern and said sixth assessment pattern.

14. The method for manufacturing semiconductor devices according to claim 13, wherein measurement of dimensions of said third assessment pattern, said fourth assessment pattern, said fifth assessment pattern, and said sixth assessment pattern is conducted for the line width in the long direction of said line pattern.

15. The method for manufacturing semiconductor devices according to claim 14, wherein measurement of dimensions of said third assessment pattern, said fourth assessment pattern, said fifth assessment pattern, and said sixth assessment pattern is conducted by an optical dimensions measuring device.

16. A method for manufacturing semiconductor devices, comprising the steps of:

accessing a plurality of exposure conditions of an exposure device having an optical axis:

adjusting the exposure device in view of the assessed exposure conditions; and using the adjusted exposure device during processing of a semiconductor wafer to fabricate the semiconductor devices, wherein the step of adjusting the exposure device comprises a preliminary step (a) and a preliminary step (b), wherein said preliminary step (a) comprises the steps of:
(i) forming a plurality of first assessment patterns and second assessment patterns on a principal surface of a first wafer-shaped workpiece with a plurality of exposure conditions in which the amount of exposure and the focal position are varied, said second assessment patterns being disposed lower than said first assessment patterns in the direction of the optical axis of said exposure device;
(ii) measuring the dimensions of said first assessment patterns and said second assessment patterns;
(iii) calculating a first difference and a first average between the measured dimensions of said first assessment patterns and the measured dimensions of said second assessment patterns that are formed with the same amount of exposure and the same focal position; and
(iv) creating baseline data with respect to the exposure conditions based on said first difference and said first average, said step of creating baseline data including the steps of:
 (1) creating a first basic formula having a first coefficient and a second coefficient by numerically expressing, with a first approximation, a variation in said first difference with respect to a variation in the focal position for each amount of exposure;
 (2) creating a second basic formula by numerically expressing, with said first approximation, a variation in said first coefficient with respect to a variation in the amount of exposure;
 (3) creating a third basic formula by numerically expressing, with the first approximation, a variation in said second coefficient with respect to a variation in the amount of exposure;
 (4) creating a fourth basic formula comprising a third coefficient and a fourth coefficient by mathematically expressing, with the first approximation, a variation in said first average with respect to a variation in the amount of exposure for each focal position;
 (5) creating a fifth basic formula by mathematically expressing, with a second approximation, a variation in said third coefficient with respect to a variation in the focal position; and
 (6) creating a sixth basic formula by mathematically expressing, with the second approximation, a variation in said fourth coefficient with respect to a variation in the focal position; and wherein said preliminary step (b) comprises the steps of:
(i) forming further first assessment patterns and further second assessment patterns on a principal surface of a second wafer-shape workpiece with a predetermined amount of exposure and focal position;
(ii) measuring the dimensions of said further first assessment patterns and the dimensions of said further second assessment patterns;
(iii) calculating a second difference and a second average between the measured dimensions of said further first assessment patterns and the measured dimensions of said second further assessment patterns; and
(iv) assessing said exposure conditions by substituting said second difference and said second average for said baseline data and then calculating the actual amount of exposure and the actual focal position that are to be set in the adjusting step, said step of assessing said exposure conditions including steps of:
 (1) deriving a first value of said first coefficient by substituting said predetermined amount of exposure for said second basic formula;
 (2) deriving a second value of said second coefficient by substituting said predetermined amount of exposure for said third basic formula;
 (3) calculating an actual focal position by substituting said second difference for said first difference of said first basic formula, substituting said first value for said first coefficient of said first basic formula, and substituting said second value for said second coefficient of said first basic formula;
 (4) deriving a third value of said third coefficient by substituting said actual focal position for said fifth basic formula;
 (5) deriving a fourth value of said fourth coefficient by substituting said actual focal position for said sixth basic formula; and
 (6) calculating an actual amount of exposure by substituting said second average for said first average of said fourth basic formula, substituting said third value for said third coefficient of said fourth basic formula, and substituting said fourth value for said fourth coefficient of said fourth basic formula.

17. A method for manufacturing semiconductor devices, comprising the steps of:

accessing a plurality of exposure conditions of an exposure device having an optical axis:

adjusting the exposure device in view of the assessed exposure conditions; and using the adjusted exposure device during processing of a semiconductor wafer to fabricate the semiconductor devices, wherein the step of adjusting the exposure device comprises a preliminary step (a) and a preliminary step (b), wherein said preliminary step (a) comprises the steps of:
(i) forming a plurality of first assessment patterns and said second assessment patterns on a principal surface of first wafer-shaped workpiece with a plurality of exposure conditions in which the amount of exposure and the focal position are varied, said first assessment patterns having a plurality of substantially rectangular line patterns and said second assessment patterns having a plurality of substantially rectangular line patterns and being disposed lower than said first assessment patterns in the direction of the optical axis of said exposure device;
(ii) measuring a shorter side of said substantially rectangular line patterns of said first assessment patterns and said second assessment patterns;
(iii) calculating a first difference and a first average between the measured dimensions of said first assessment patterns and the measured dimensions of said second assessment patterns that are formed with the same amount of exposure and the same focal position; and
(iv) creating baseline data with respect to the exposure conditions based on said first difference and said first average, said step of creating baseline data including the steps of:
 (1) creating a first basic formula having a first coefficient and a second coefficient by numerically expressing, with a first approximation, a variation in said first difference with respect to a variation in the focal position for each amount of exposure;

(2) creating a second basic formula by numerically expressing, with said first approximation, a variation in said first coefficient with respect to a variation in the amount of exposure;

(3) creating a third basic formula by numerically expressing, with the first approximation, a variation in said second coefficient with respect to a variation in the amount of exposure;

(4) creating a fourth basic formula comprising a third coefficient and a fourth coefficient by mathematically expressing, with the first approximation, a variation in said first average with respect to a variation in the amount of exposure for each focal position;

(5) creating a fifth basic formula by mathematically expressing, with a second approximation, a variation in said third coefficient with respect to a variation in the focal position; and (6) creating a sixth basic formula by mathematically expressing, with the second approximation, a variation in said fourth coefficient with respect to a variation in the focal position; and wherein said preliminary step (b) comprises the steps of:

(i) forming further first assessment patterns and further second assessment patterns on a principal surface of a second wafer-shaped workpiece with a predetermined amount of an exposure and focal position;

(ii) measuring the dimensions of said further first assessment patterns and the dimensions of said further second assessment patterns;

(iii) calculating a second difference and a second average between the measured dimensions of said further first assessment patterns and the measured dimensions of said further second assessment patterns; and (iv) assessing said exposure conditions by substituting said second difference and said second average for said baseline data and then calculating the actual amount of exposure and the actual focal position that are to be set in the adjusting step, said step of assessing said exposure conditions including steps of:

(1) deriving a first value of said first coefficient by substituting said predetermined amount of exposure for said second basic formula;

(2) deriving a second value of said second coefficient by substituting said predetermined amount of exposure for said third basic formula;

(3) calculating an actual focal position by substituting said second difference for said first difference of said first basic formula, substituting said first value for said first coefficient of said first basic formula, and substituting said second value for said second coefficient of said first basic formula;

(4) deriving a third value of said third coefficient by substituting said actual focal position for said fifth basic formula;

(5) deriving a fourth value of said fourth coefficient by substituting said actual focal position for said sixth basic formula; and (6) calculating an actual amount of exposure by substituting said second average for said first average of said fourth basic formula, substituting said third value for said third coefficient of said fourth basic formula, and substituting said fourth value for said fourth coefficient of said fourth basic formula.

18. The method of manufacturing semiconductor devices according to claim 1, wherein the first and second workpieces are semiconductor wafers.

\* \* \* \* \*